United States Patent
Akarvardar

(10) Patent No.: US 9,324,617 B1
(45) Date of Patent: Apr. 26, 2016

(54) METHODS OF FORMING ELASTICALLY RELAXED SIGE VIRTUAL SUBSTRATES ON BULK SILICON

(71) Applicant: GLOBALFOUNDRIES Inc., Grand Cayman (KY)

(72) Inventor: Murat Kerem Akarvardar, Saratoga Springs, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/715,050

(22) Filed: May 18, 2015

(51) Int. Cl.
- *H01L 21/76* (2006.01)
- *H01L 21/8234* (2006.01)
- *H01L 21/02* (2006.01)
- *H01L 21/306* (2006.01)
- *H01L 21/762* (2006.01)
- *H01L 29/10* (2006.01)

(52) U.S. Cl.
CPC .... *H01L 21/823412* (2013.01); *H01L 21/0245* (2013.01); *H01L 21/02381* (2013.01); *H01L 21/02532* (2013.01); *H01L 21/02546* (2013.01); *H01L 21/30604* (2013.01); *H01L 21/76224* (2013.01); *H01L 21/823481* (2013.01); *H01L 29/1033* (2013.01)

(58) Field of Classification Search
CPC ............... H01L 21/823412; H01L 21/823481; H01L 21/02381; H01L 21/0245; H01L 21/02532; H01L 21/02546; H01L 21/30604; H01L 21/76224; H01L 29/1033
USPC ................... 438/151, 157, 164, 283, 300, 429
See application file for complete search history.

(56) References Cited

U.S. PATENT DOCUMENTS

| | | | |
|---|---|---|---|
| 9,166,025 B1 | 10/2015 | Pawlak | |
| 9,219,139 B2 * | 12/2015 | Adam | ...................... H01L 29/78 |
| 2005/0077553 A1 * | 4/2005 | Kim | ................ H01L 21/823412 257/288 |
| 2014/0021538 A1 * | 1/2014 | Bangsaruntip | .... H01L 29/66795 257/331 |
| 2014/0084342 A1 * | 3/2014 | Cappellani | ............. B82Y 10/00 257/192 |
| 2014/0191321 A1 | 7/2014 | Cheng et al. | |
| 2014/0353767 A1 | 12/2014 | Liu et al. | |
| 2015/0021715 A1 * | 1/2015 | Chang | ................. H01L 29/0669 257/412 |
| 2015/0194489 A1 * | 7/2015 | Barraud | .............. H01L 29/1033 257/9 |
| 2015/0255605 A1 | 9/2015 | Loubet et al. | |
| 2015/0364603 A1 | 12/2015 | Cheng et al. | |

OTHER PUBLICATIONS

Liang et al., "Critical thickness enhancement of epitaxial SiGe films grown on small structures," Journal of Applied Physics, 97, 043519, 2005.

Mooney et al., "Elastic strain relaxation in free-standing SiGe/Si structures," Applied Physics Letters, 84, 1093, 2004.

Notice of Allowance from related U.S. Appl. No. 14/715,109 dated Mar. 1, 2016.

* cited by examiner

Primary Examiner — Kevin M Picardat
(74) Attorney, Agent, or Firm — Amerson Law Firm, PLLC

(57) ABSTRACT

One method disclosed herein includes forming a virtual substrate by forming a sacrificial semiconductor material in a trench between a plurality of silicon fin structures formed in a bulk silicon substrate, forming a layer of silicon above the silicon fin structures and the sacrificial semiconductor material, performing at least one etching process to selectively remove the sacrificial semiconductor material relative to the silicon fin structures and the layer of silicon so as to define a cavity, forming a non-sacrificial semiconductor material on the layer of silicon and forming a layer of strained channel semiconductor material above the non-sacrificial semiconductor material positioned above the upper surface of the layer of silicon.

25 Claims, 34 Drawing Sheets

View X-X

View Y-Y

View Z-Z

View X-X

View Y-Y

View Z-Z

View A-A

View B-B

METHODS OF FORMING ELASTICALLY RELAXED SIGE VIRTUAL SUBSTRATES ON BULK SILICON

BACKGROUND OF THE INVENTION

1. Field of the Invention

Generally, the present disclosure relates to the manufacture of FET semiconductor devices, and, more specifically, to various methods of forming elastically relaxed silicon-germanium (SiGe) virtual substrates on bulk silicon.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. Transistors come in a variety of different physical configurations, e.g., planar devices, FinFET devices, nanowire devices, etc. Irrespective of their physical configuration, all FET devices include a doped source region, a doped drain region and a channel region that is positioned between the source region and the drain region, and a gate electrode positioned above the channel region. Current flow through the FET is controlled by controlling the voltage applied to the gate electrode. For example, for an NMOS device, if there is no voltage applied to the gate electrode, then there is no current flow through the channel region of the NMOS device (ignoring undesirable leakage currents, which are relatively small). However, when an appropriate positive voltage is applied to the gate electrode, the channel region of the NMOS device becomes conductive, and electrical current is permitted to flow between the source region and the drain region through the conductive channel region.

Historically, silicon has been the dominant semiconductor material that has been used in fabricated integrated circuit devices. That is, the source region, drain region and the channel region were all formed in silicon. To improve the operating speed of FETs, and to increase the density of FETs on an integrated circuit device, device designers have greatly reduced the physical size of FETs over the past decades. More specifically, the channel length of FETs has been significantly decreased, which has resulted in improving the switching speed and in lowering operation currents and voltages of FETs. However, with the constant demand for ever increasing performance relative to previous device generations, device designers are currently investigating using semiconductor materials other than silicon as the basic substrate material, such as silicon germanium (SiGe), germanium (Ge) and so-called III-V materials. Materials such as SiGe and Ge are interesting to devices designers since they exhibit higher carrier mobility (for both electrons (NMOS devices) and holes (PMOS devices) as compared to silicon.

However, the formation of SiGe and Ge materials on silicon can be difficult due to lattice mismatches between such materials (for example there is 4.2% lattice mismatch between silicon and germanium). Due to this lattice mismatch, defects will be generated in a layer of SiGe (with a relatively larger lattice) when it is formed (by epitaxial deposition) on a silicon substrate (relatively smaller lattice) since the SiGe lattice will "shrink" to match the lattice structure of the silicon substrate. Ideally, given required performance demands, a semiconductor material that will be used for the channel region of an advanced transistor device should have, at most, a very limited number of defects (e.g., well below about 10E4 defects/cm$^2$ near the very uppermost surface). One technique that has been employed to try to reduce the number defects in SiGe layers grown on silicon substrates is depicted in FIG. 1A, wherein multiple layers of SiGe (with different concentrations of germanium) with different lattice sizes were formed between the substrate 12 and the final upper layer 18 in an attempt to reduce the number of defects in the uppermost layer 18. More specifically, in one example, a SiGe$_{0.25}$ layer 14 would be formed on the silicon substrate 12, a SiGe$_{0.60}$ layer 16 would be formed on the SiGe$_{0.25}$ layer 14, and finally a layer of substantially pure germanium 18 would be formed on the SiGe$_{0.60}$ layer 16. The lattice size of the layers 12, 14, 16 and 18 are each greater than the preceding layer or substrate 12. However, by formation of these "graded" layers of SiGe (with varying concentrations of germanium) and varying lattice sizes, it was intended that many of the defects in the lower layers (e.g., 14, 16) would not propagate into the final layer 18, which would serve as the channel semiconductor material. This process involved the plastic relaxation of the SiGe materials due to the fact that defects were generated or created in the layers of SiGe material, especially the lower layers. The graded arrangement of SiGe layers was an attempt to reduce the number of defects at the surface of the uppermost layer, e.g., the layer 18. Inducing such defects sometimes included techniques like exceeding the critical thickness of the material, implanting materials such as helium, hydrogen or argon at the interface between the SiGe layer 14 and the silicon substrate 12, etc. Although the generation of such defects usually served the purpose of achieving relaxation of the films, subsequent processing operations that were performed to reduce the number of defects present in such relaxed films has not been equally successful. As noted above, to the inventor's knowledge, there is no technique that provides for the formation of SiGe films on bulk silicon substrates wherein the defect density in the resulting SiGe film is consistently and reliably at or below about 10E4 defects/cm$^2$.

In contrast to plastic relaxation, elastic relaxation is another technique that is employed in an attempt to form relaxed semiconductor material on compliant substrates. Elastic relaxation of epi material (e.g., SiGe) formed on free-standing silicon beams has been demonstrated on silicon-on-insulator (SOI) substrates where removal of portions of the buried oxide layer (BOX) resulted in "beams" of silicon (the active layer) that were supported by the remaining portions of the buried oxide layer. See, e.g., Liang et al., "Critical thickness enhancement of epitaxial SiGe film grown on small structures," *Journal of Applied Physics*, 97, 043519 (2005) and Mooney et al., "Elastic strain relaxation of free-standing SiGe/Si structures," *Applied Physics Letters*, 84, 1093 (2004). FIGS. 1B-1E simplistically depict an illustrative process flow for forming such layers on a starting SOI substrate 20. As shown in FIG. 1B, in general, the SOI substrate 20 is comprised of a bulk silicon substrate 22, a buried insulation layer (or "BOX" layer) 24 (that is typically comprised of silicon dioxide), and an active layer 26 comprised of silicon. Transistor devices are normally formed in and above the active layer 26. FIG. 1C depicts the SOI substrate 20 after the active layer 26 has been patterned using known photolithography and etching techniques to expose portions of the BOX layer 24. FIG. 1D depicts the SOI substrate 20 after an isotropic etching process was performed to remove portions of the BOX layer 24 selectively relative to the surrounding materials. This results in the formation of a BOX pedestal 24A that supports the active layer 26. The active layer 26 now constitutes two free-standing beams 26A, 26B of silicon materials that are anchored to the BOX pedestal 24A. FIG. 1E depicts the SOI substrate after a layer of SiGe material 28 was epitaxially grown on the exposed portions of the active layer 26 and on the exposed surface of the substrate 22. The above papers indicate that the SiGe material 28 that is formed on the free-standing beams 26A, 26B of silicon material is elastically relaxed even in cases where the thickness of the SiGe material exceeds its critical thickness because the strain is transferred from the relatively thicker SiGe material 28 to the relatively thinner material—the free-standing beams 26A, 26B—due to the compliant nature of the free-standing beams 26A, 26B relative to the SiGe material 28. In contrast, the SiGe material 28 that is formed on the exposed substrate 22 is in a strained condition because the lattice of the SiGe material 28 "shrinks" to match the smaller lattice of the silicon substrate 22. This occurs because the silicon substrate 22 is much thicker and much stiffer than the SiGe material 28 that is formed on the substrate 22.

However, SOI substrates are significantly more expensive than bulk silicon substrates. Given the competitive nature of the semiconductor manufacturing business, the use of more expensive SOI substrates in manufacturing integrated circuit products would likely make the resulting products too expensive, at least in some applications. What is needed is a technique for manufacturing elastically relaxed SiGe virtual substrates on bulk silicon substrates that is also compatible with existing manufacturing process flows.

The present disclosure is directed to various methods that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming elastically relaxed silicon-germanium (SiGe) virtual substrates on bulk silicon. One illustrative method disclosed herein includes, among other things, forming a sacrificial semiconductor material in a trench between a plurality of silicon fin structures in a bulk silicon substrate and forming a layer of silicon above the silicon fin structures and the sacrificial semiconductor material. In this embodiment, the method also includes performing at least one etching process to selectively remove the sacrificial semiconductor material relative to the silicon fin structures and the layer of silicon so as to define a cavity, forming a non-sacrificial semiconductor material on the layer of silicon and forming a layer of strained channel semiconductor material above the non-sacrificial semiconductor material positioned above the upper surface of the layer of silicon.

Another illustrative method disclosed herein includes, among other things, forming a sacrificial semiconductor material in a trench between a plurality of silicon fin structures formed in a bulk silicon substrate, forming a layer of silicon above an upper surface of the silicon fin structures and above an upper surface of the sacrificial semiconductor material, and performing at least one etching process to selectively remove the sacrificial semiconductor material relative to the silicon fin structures and the layer of silicon, so as to define a cavity between the silicon fin structures. In this example, the method also includes forming a non-sacrificial semiconductor material on the layer of silicon and on the bulk substrate and forming a layer of strained channel semiconductor material above the non-sacrificial semiconductor material positioned above the upper surface of the layer of silicon.

BRIEF DESCRIPTION OF THE DRAWINGS

The disclosure may be understood by reference to the following description taken in conjunction with the accompanying drawings, in which like reference numerals identify like elements, and in which.

Figure 1A:
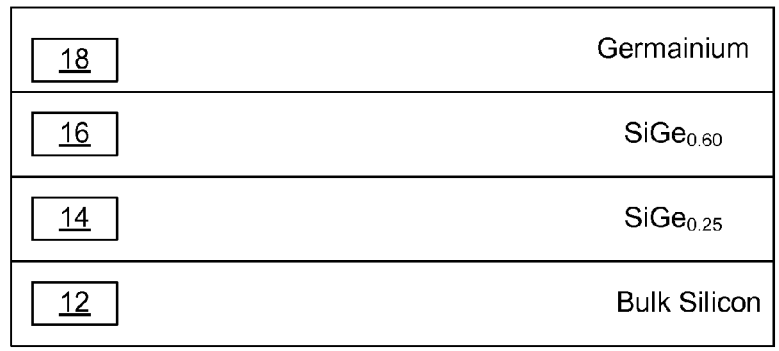
FIG. 1A depicts an example of a prior art technique wherein multiple layers of SiGe materials are formed above a bulk silicon substrate so as to achieve film relaxation by plastic relaxation techniques.
Figure 1B:
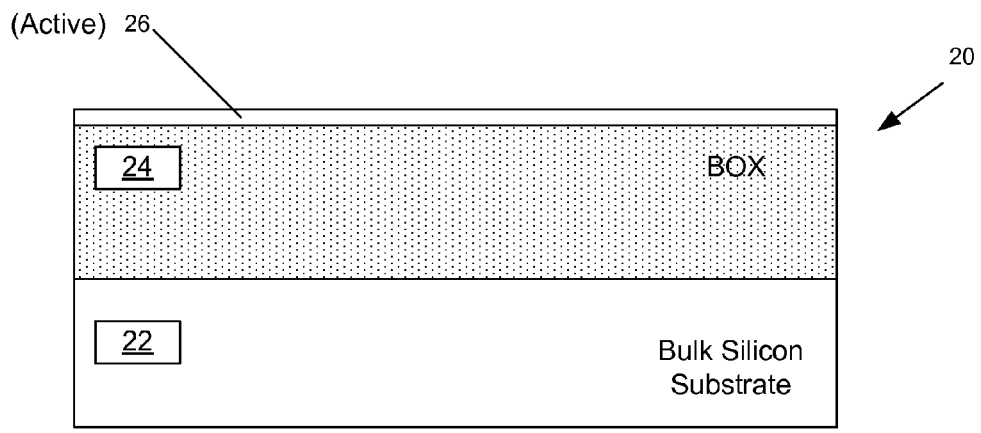
FIGS. 1B-1E depict an example of a prior art technique wherein a layer of SiGe material is formed on free-standing beams of the active layer of an SOI substrate so as to achieve film relaxation by elastic relaxation techniques.
Figure 1C:
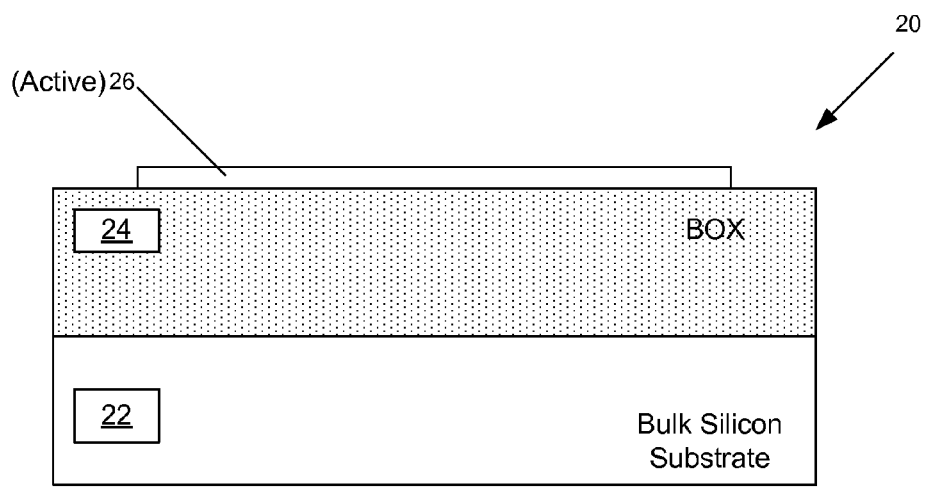
Figure 1D:
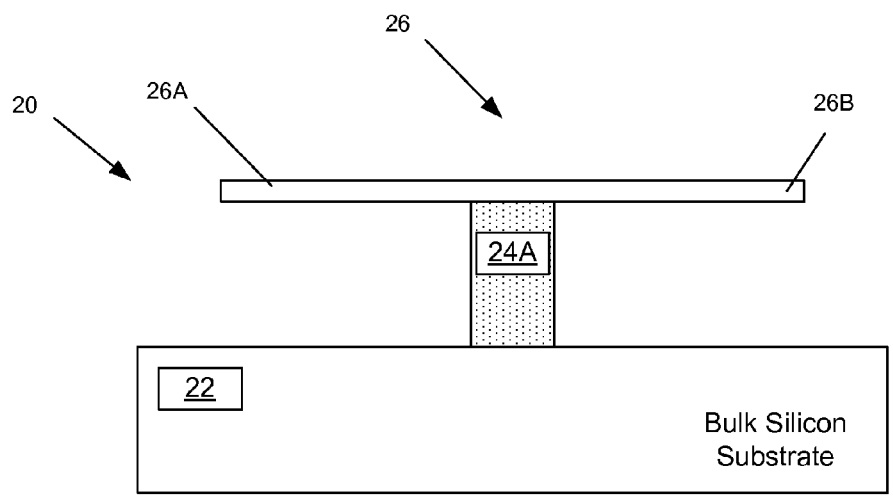
Figure 1E:
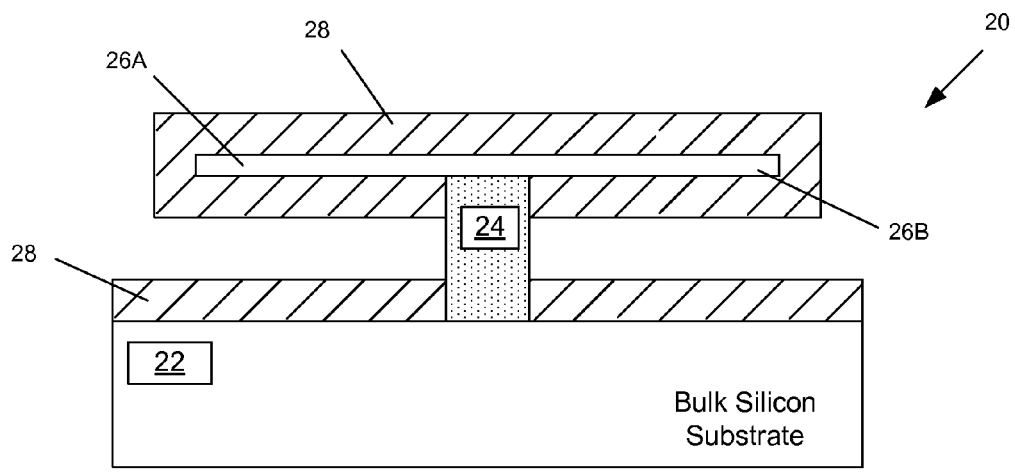

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 2A:
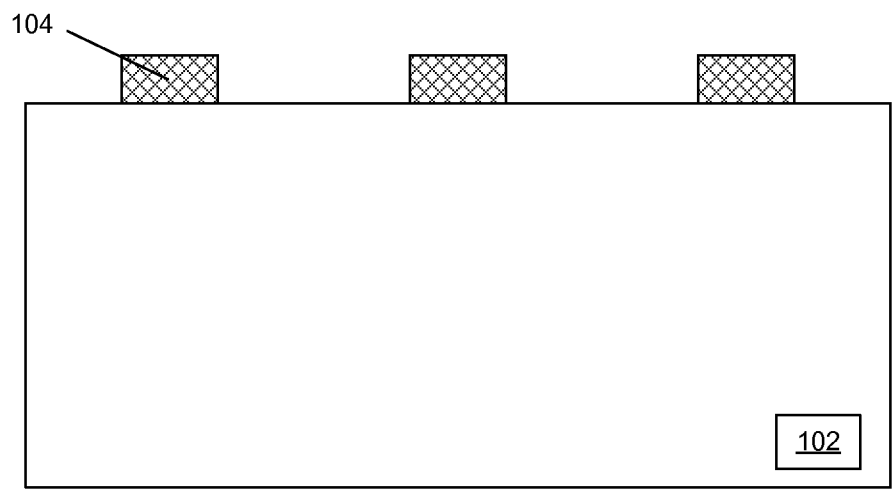
FIGS. 2A-2S depict various illustrative novel methods disclosed herein for forming elastically relaxed silicon-germanium (SiGe) virtual substrates on bulk silicon.
Figure 2B:
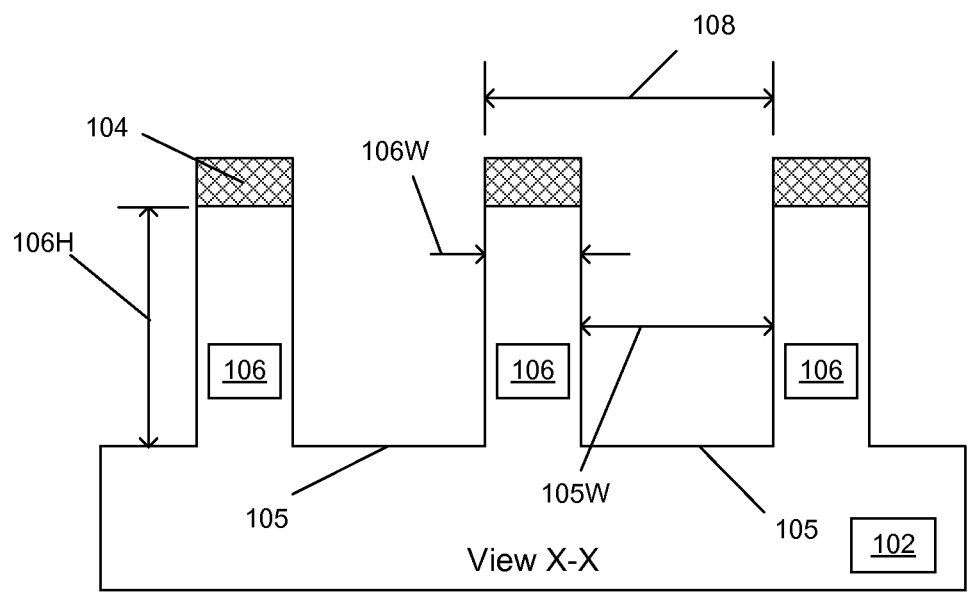
Figure 2C:
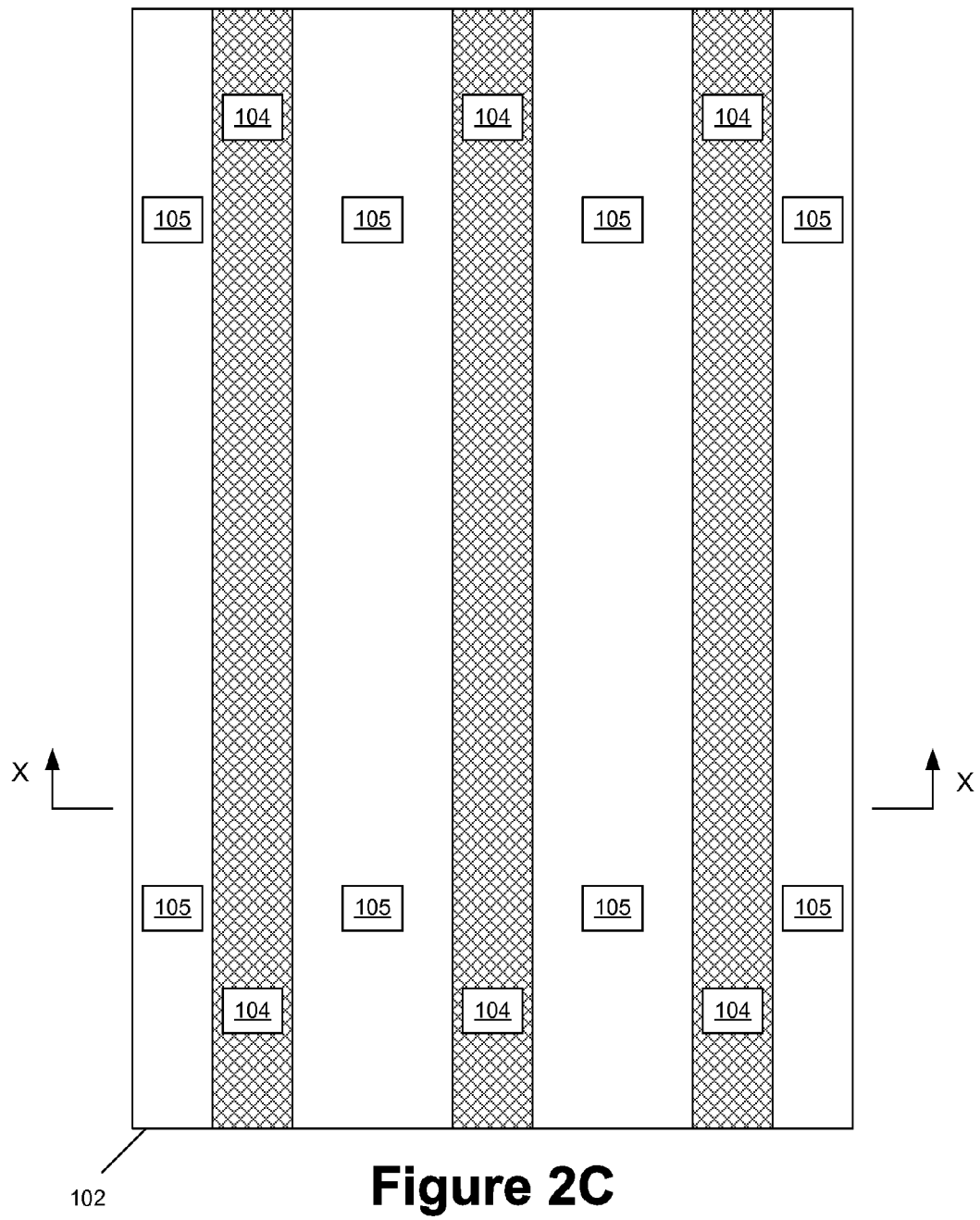
Figure 2D:
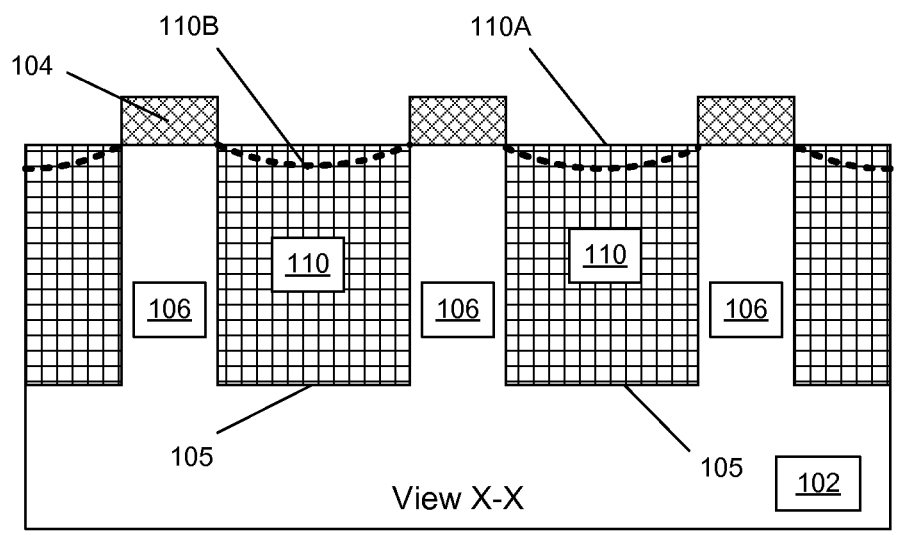
Figure 2E:
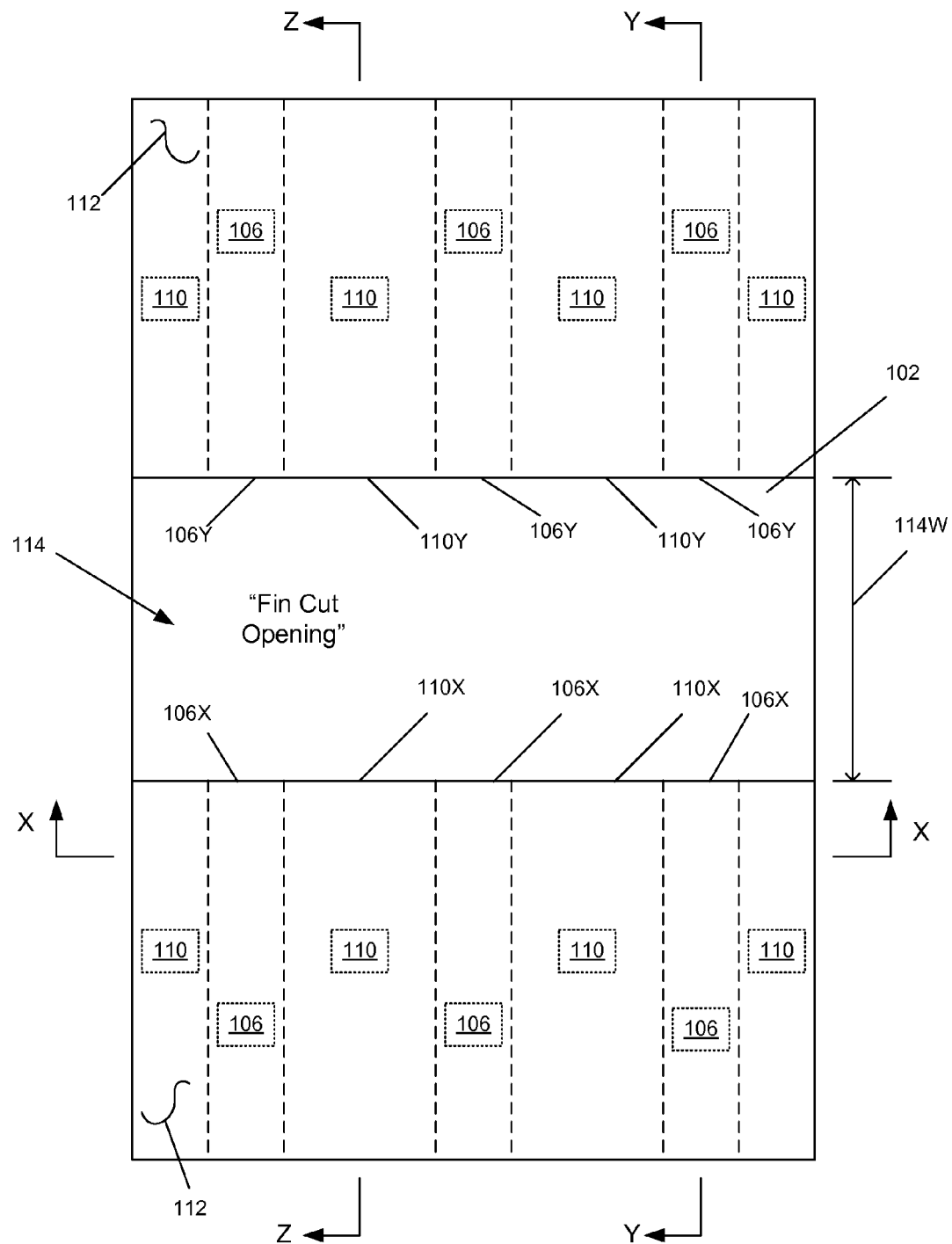
Figure 2F:
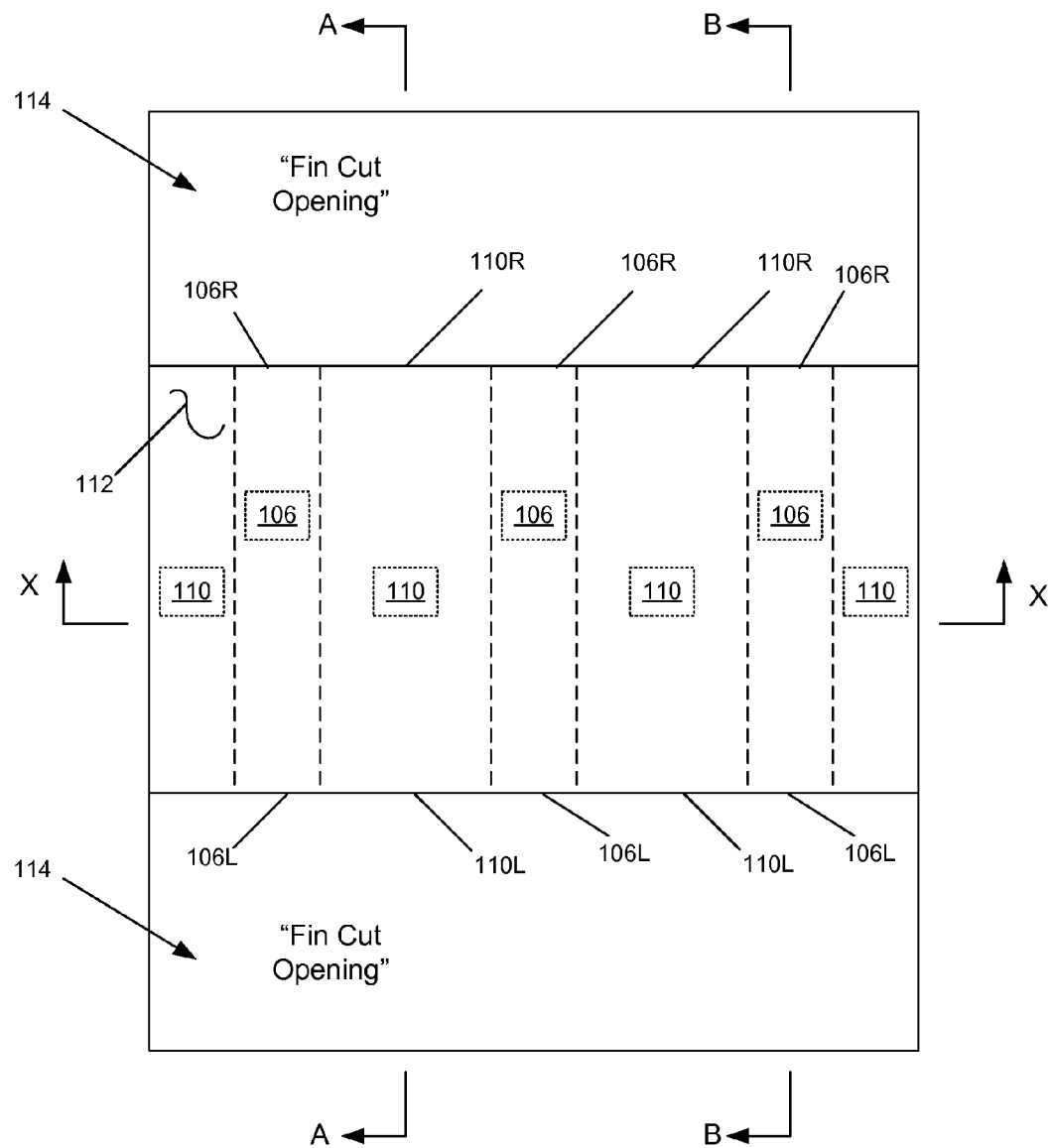
Figure 2G:
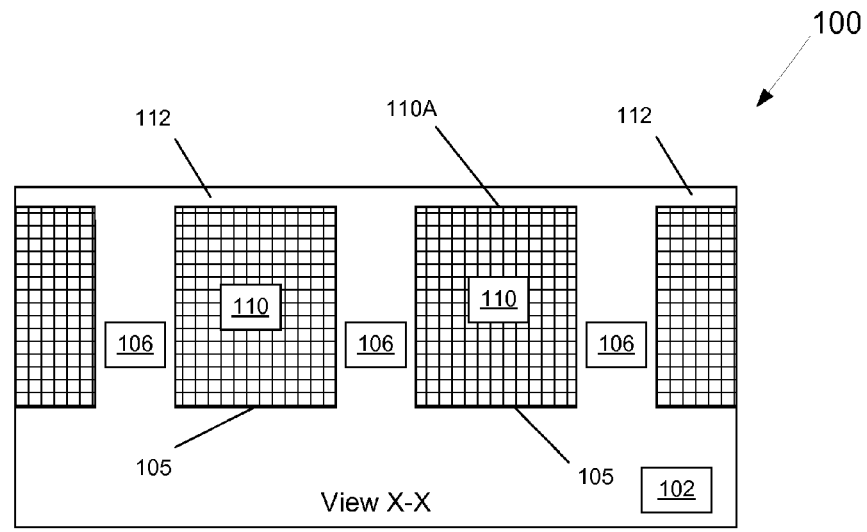
Figure 2G:
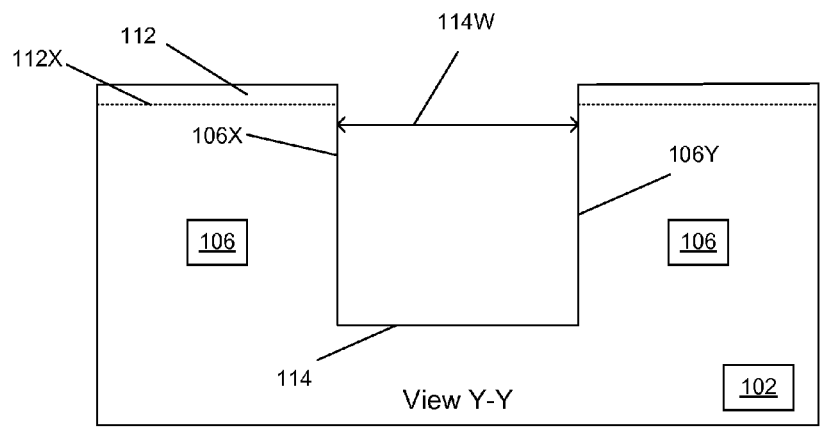
Figure 2G:
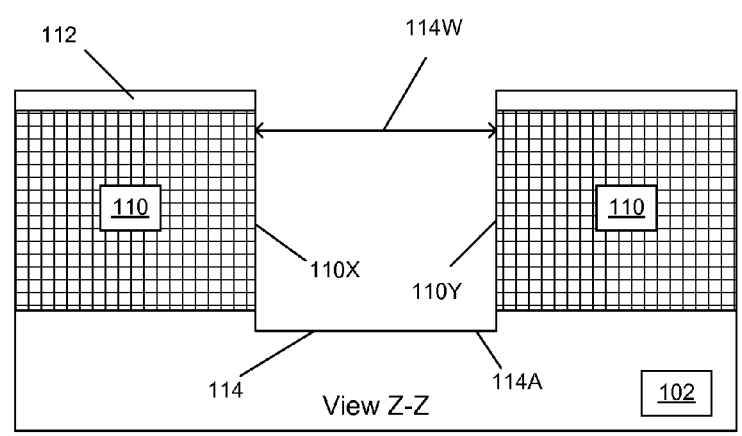
Figure 2H:
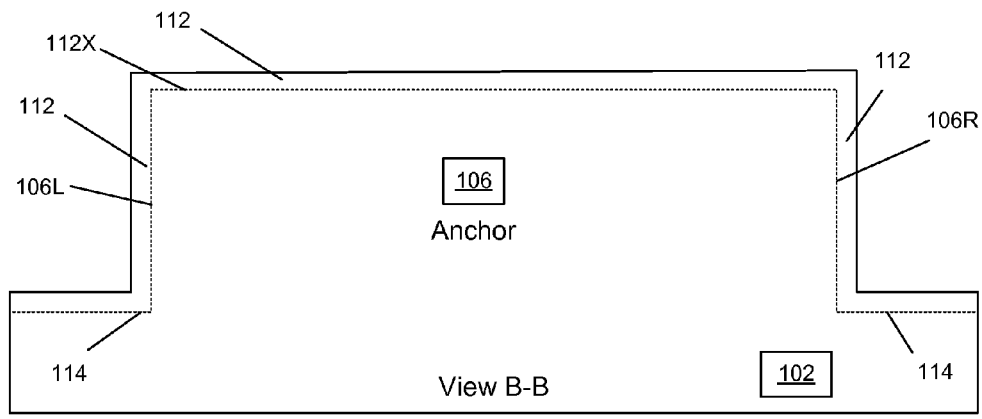
Figure 2H:
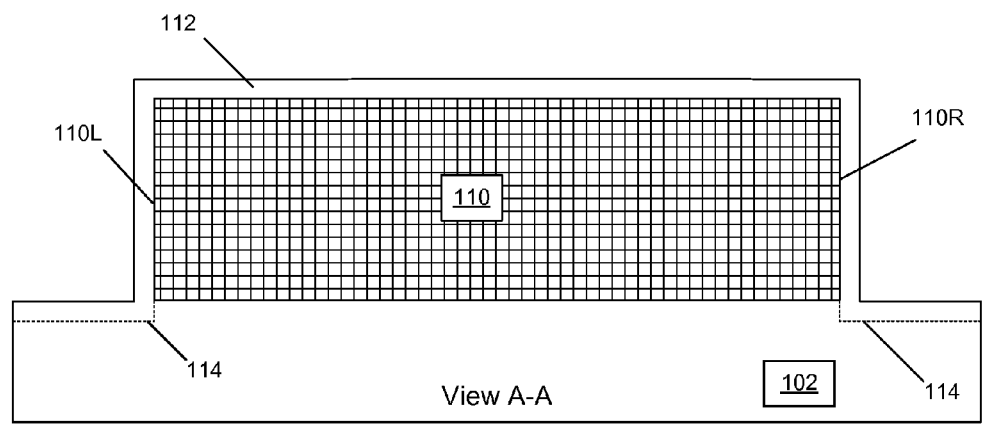
Figure 2I:
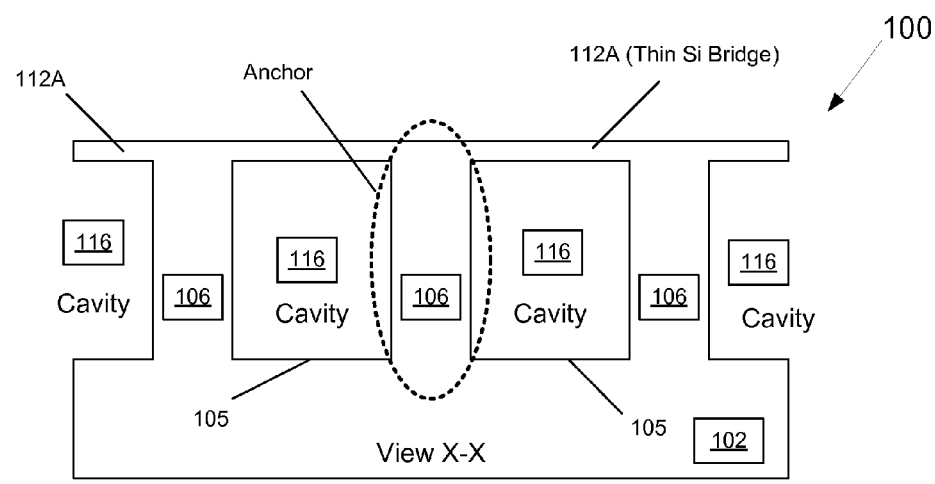
Figure 2I:
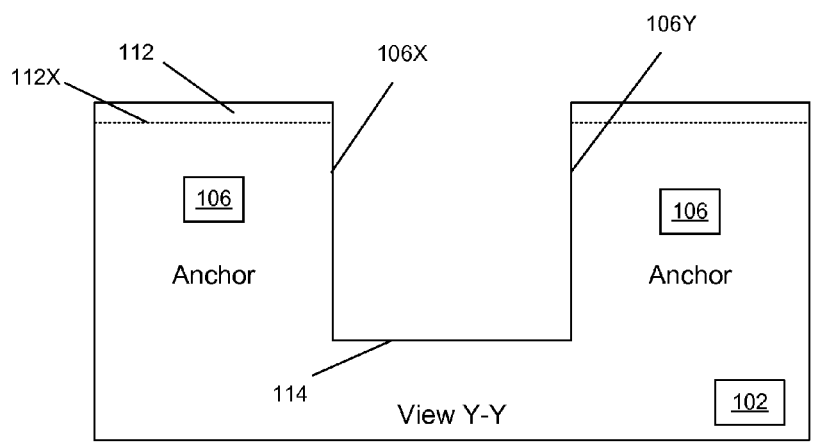
Figure 2I:
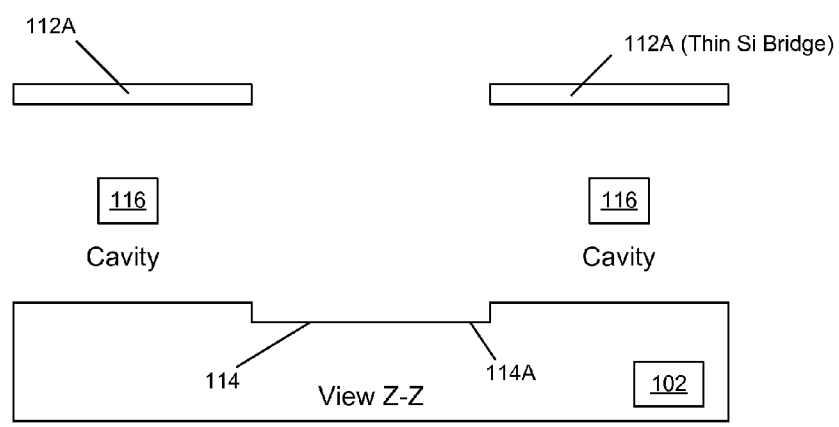
Figure 2J:
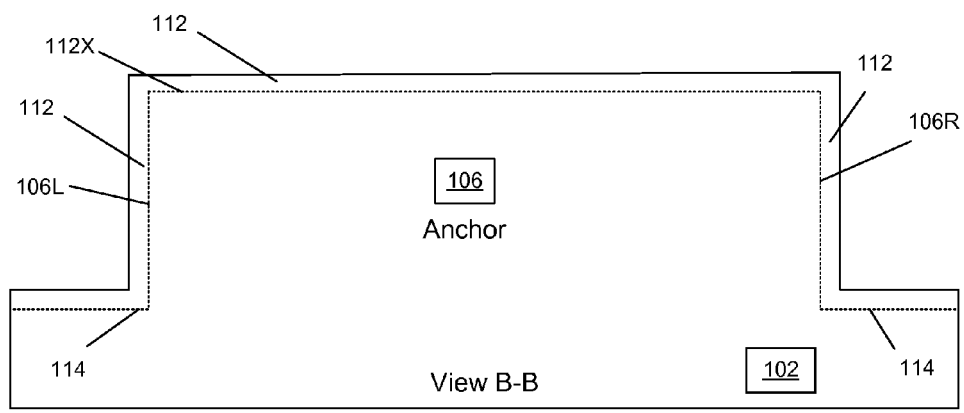
Figure 2J:
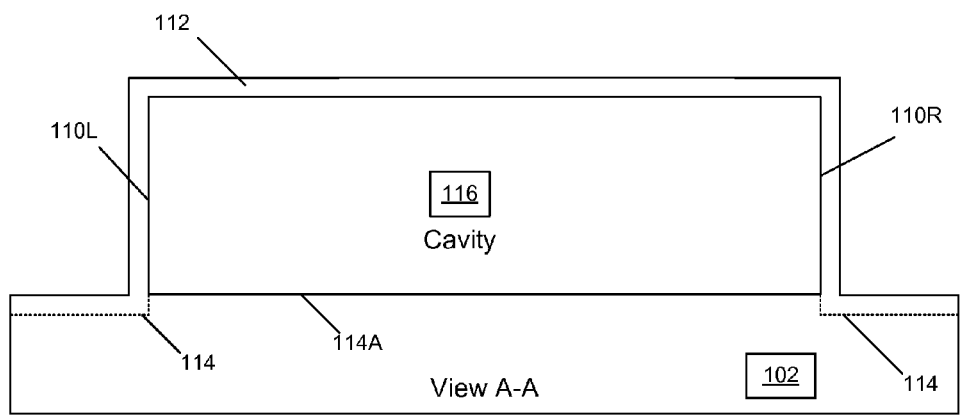
Figure 2K:
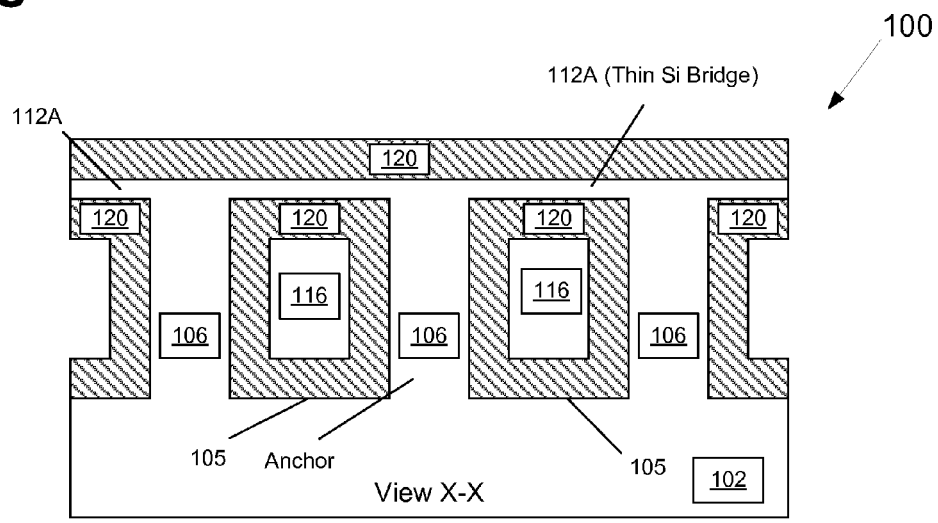
Figure 2K:
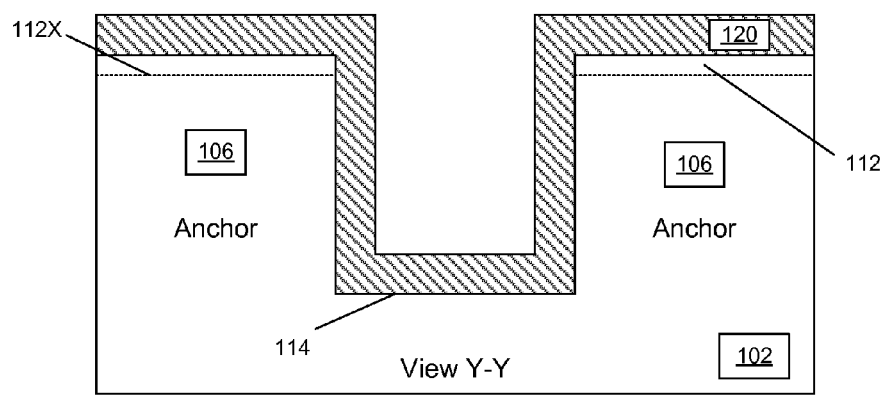
Figure 2K:
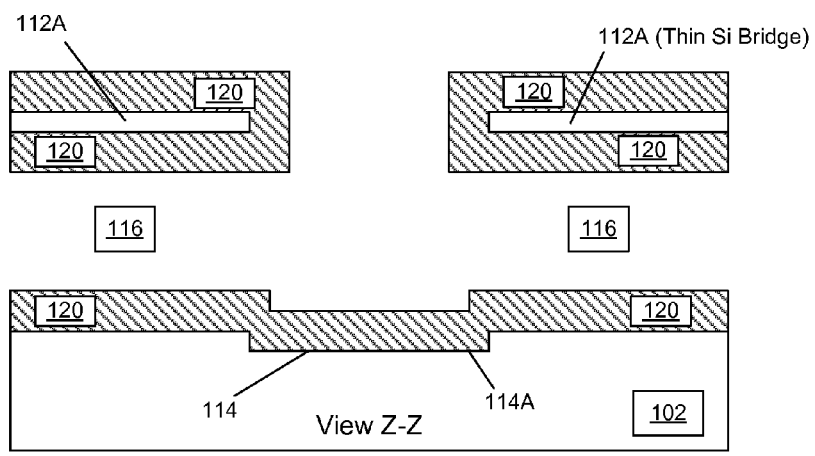
Figure 2L:
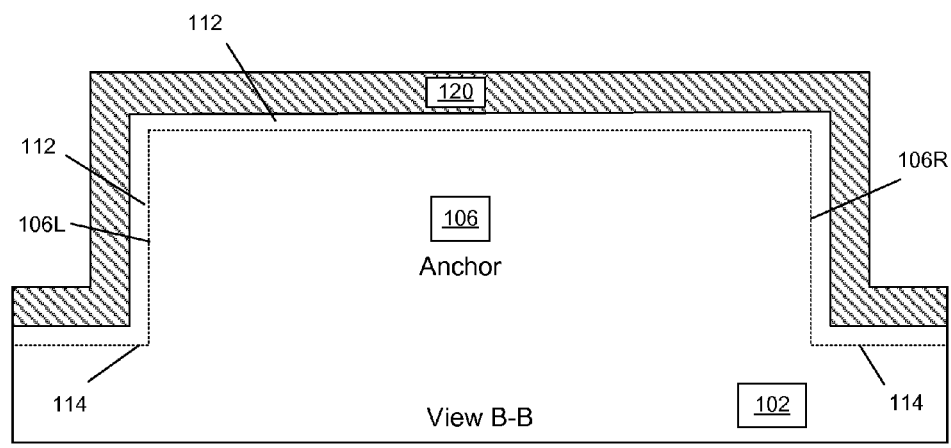
Figure 2L:
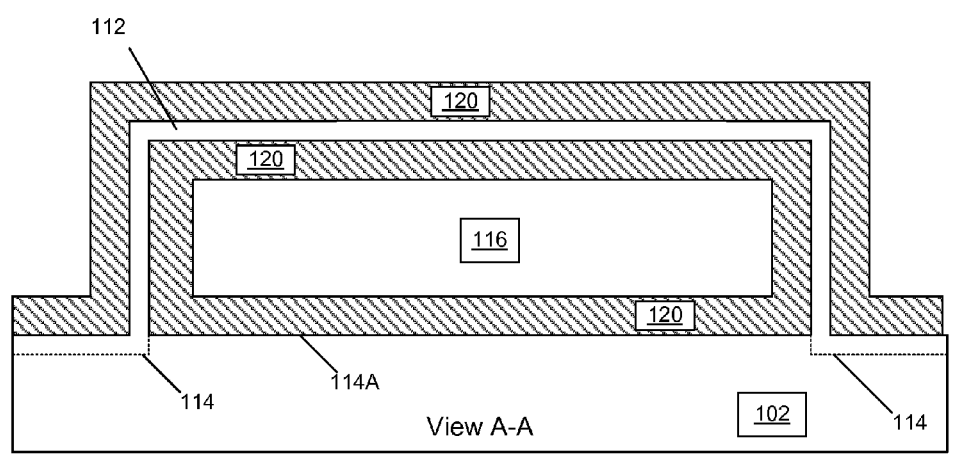
Figure 2M:
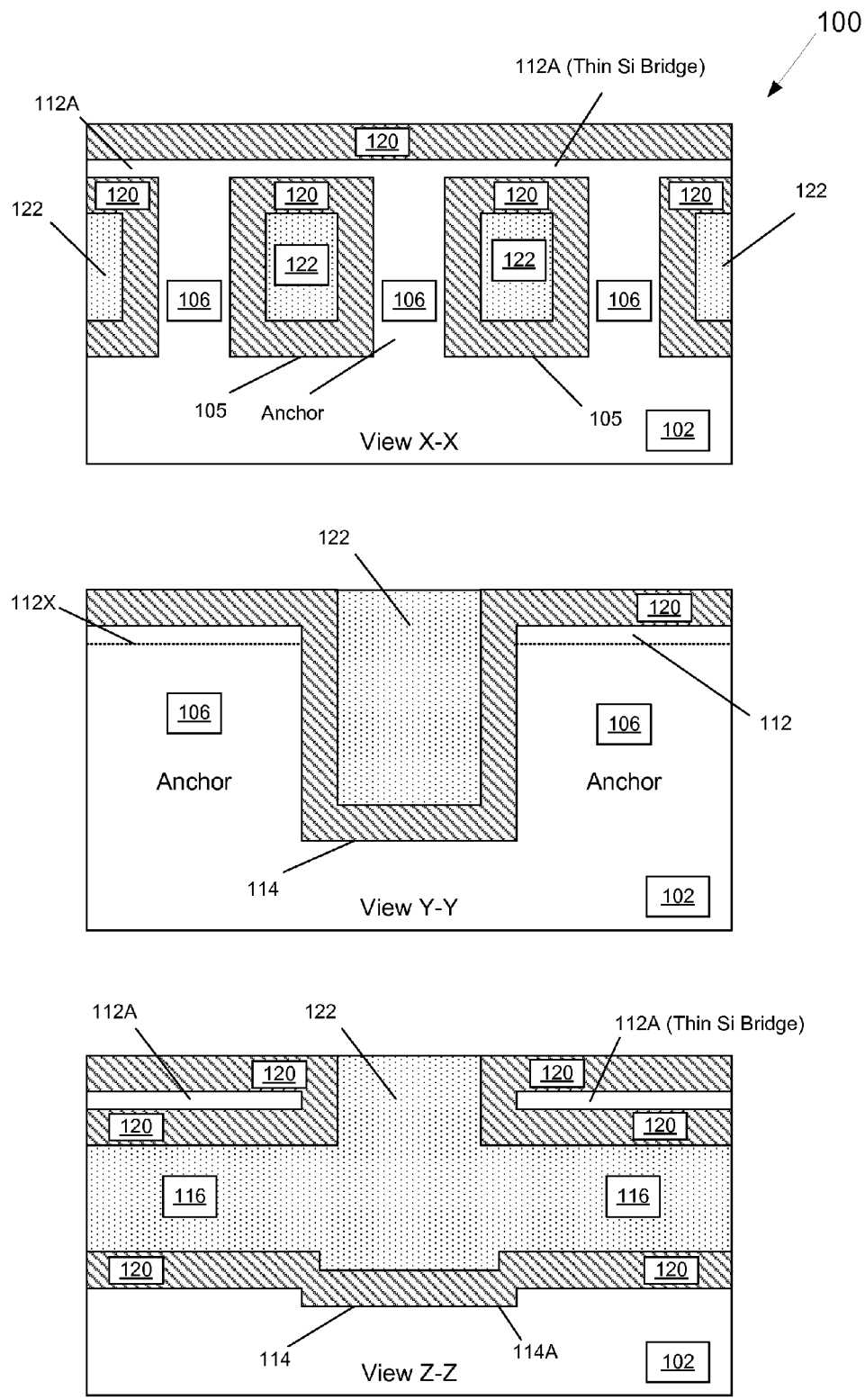
Figure 2N:
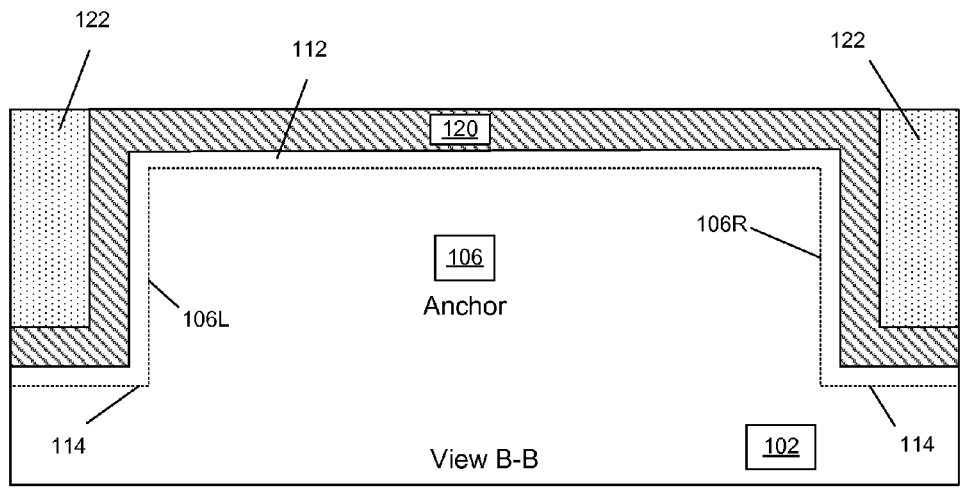
Figure 2N:
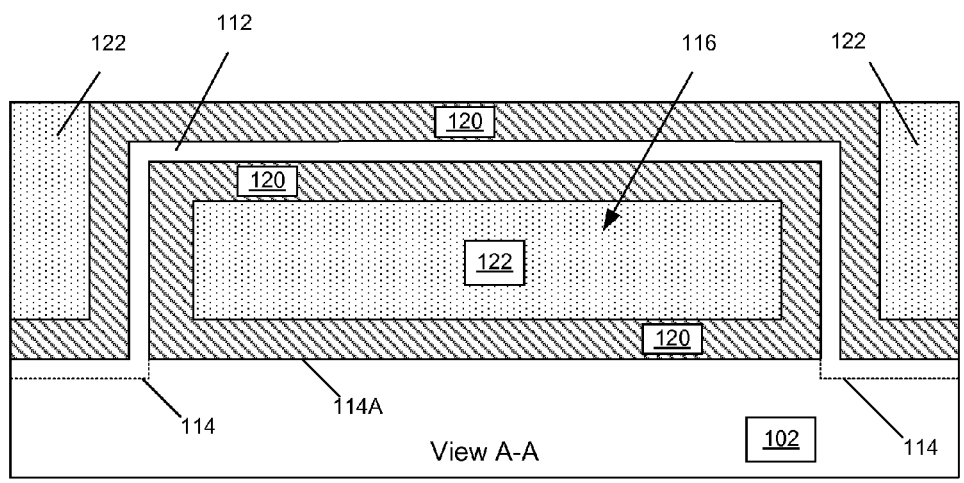
Figure 2O:
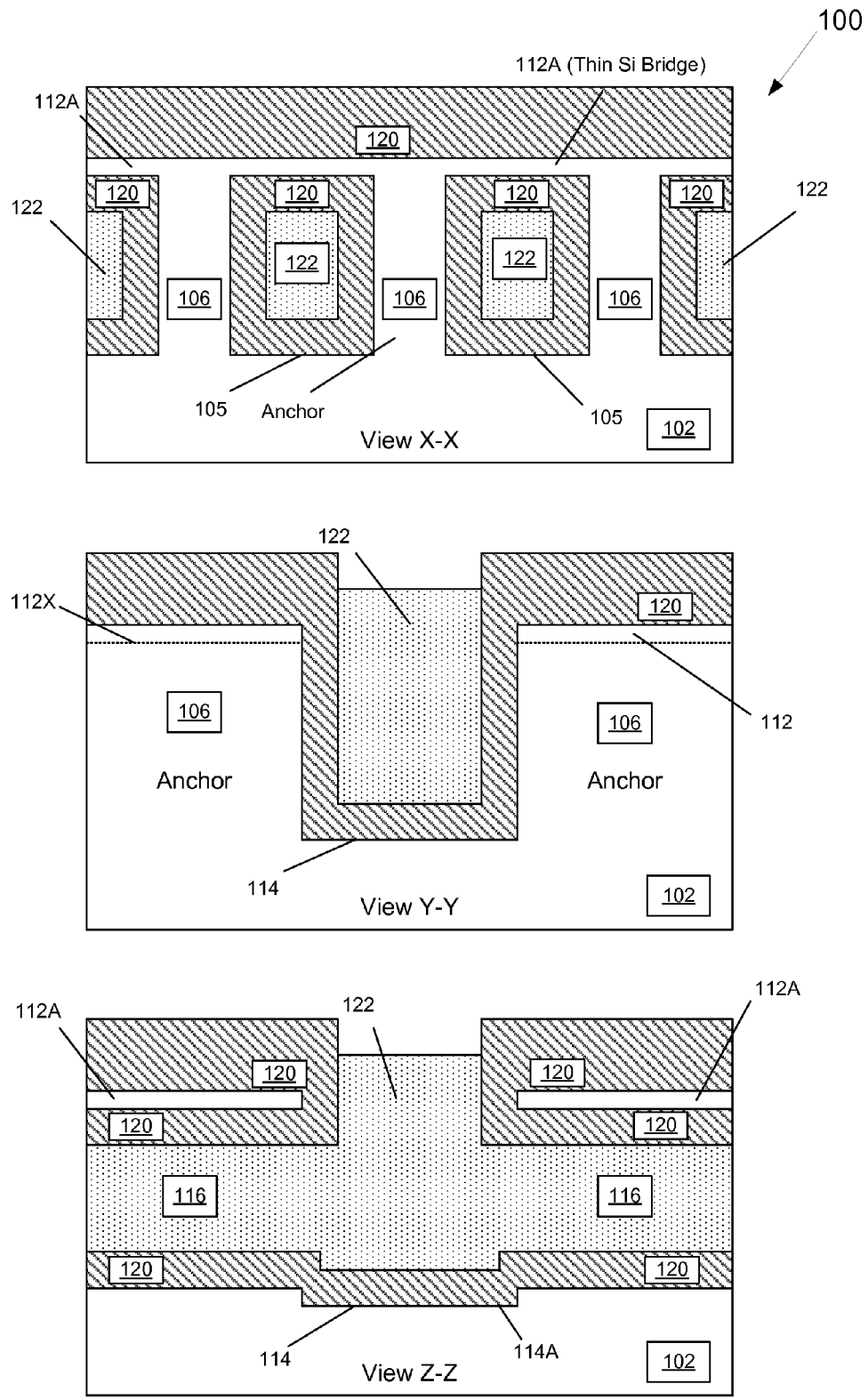
Figure 2P:
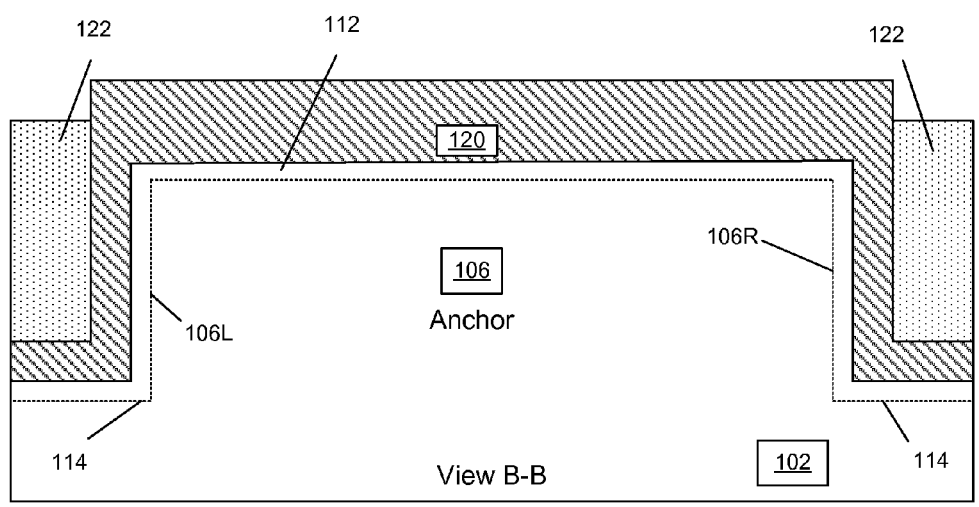
Figure 2P:
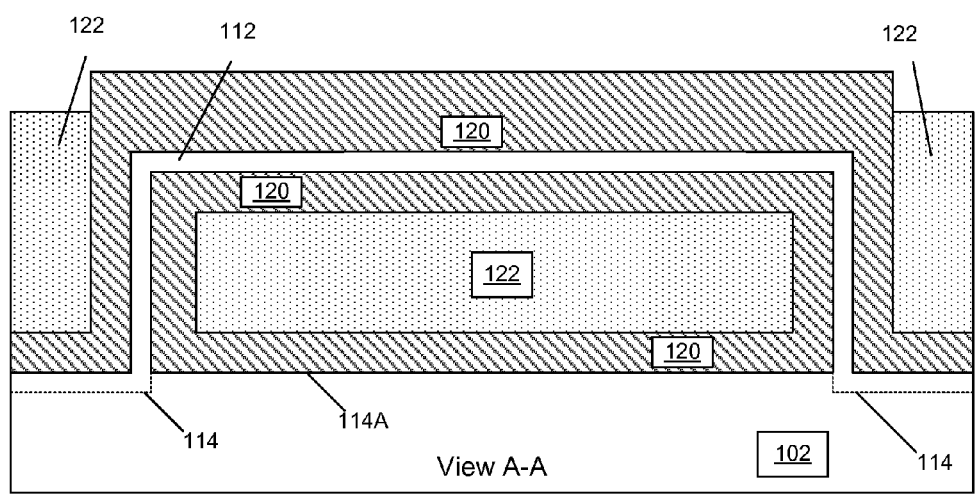
Figure 2Q:
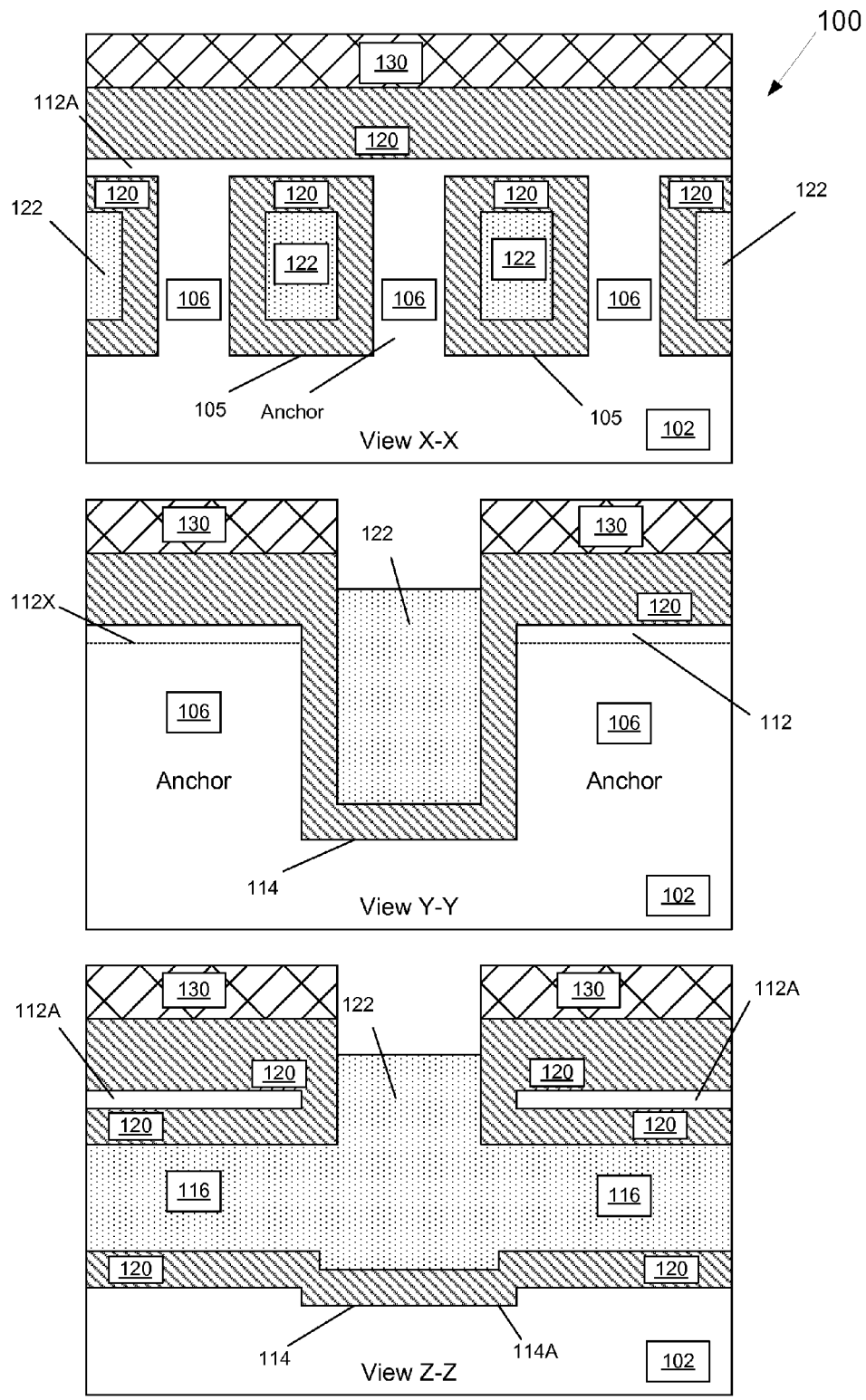
Figure 2R:
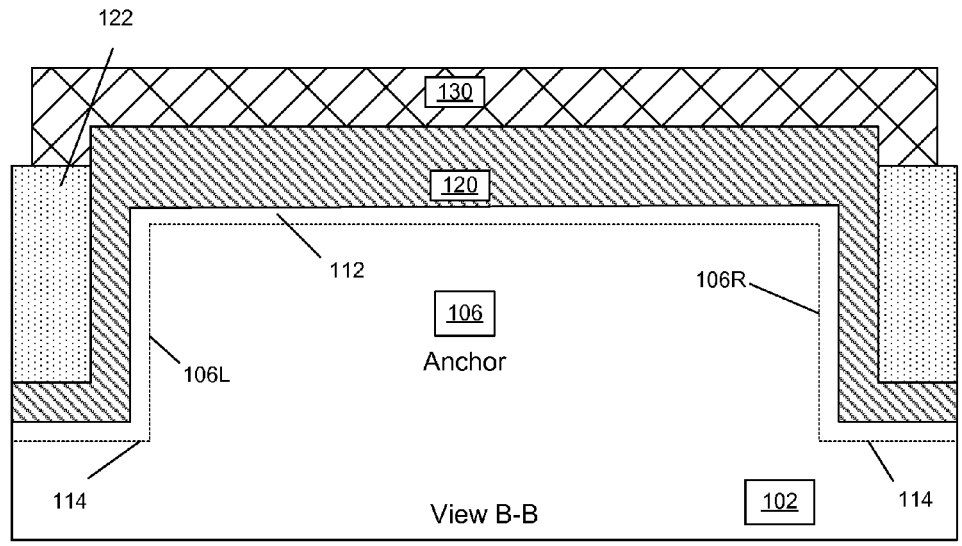
Figure 2R:
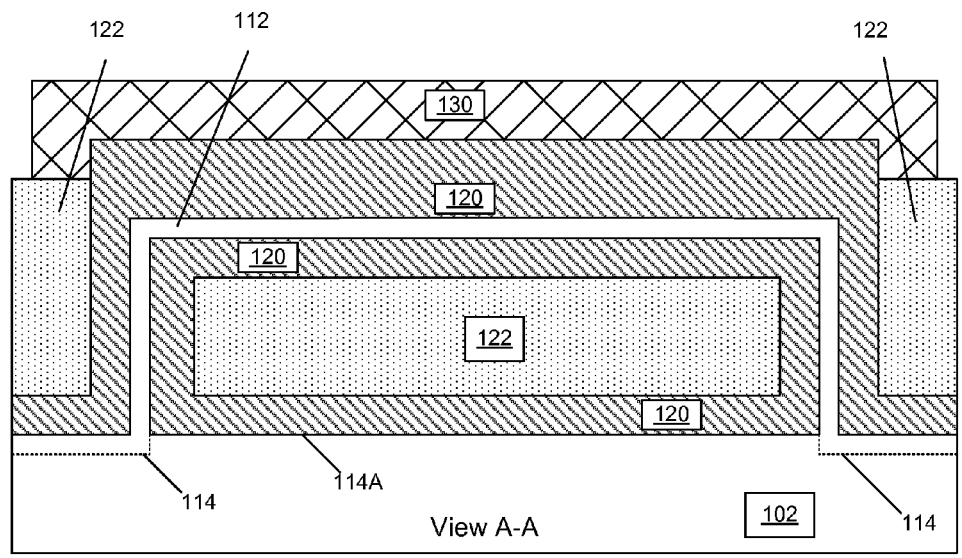
Figure 2S:
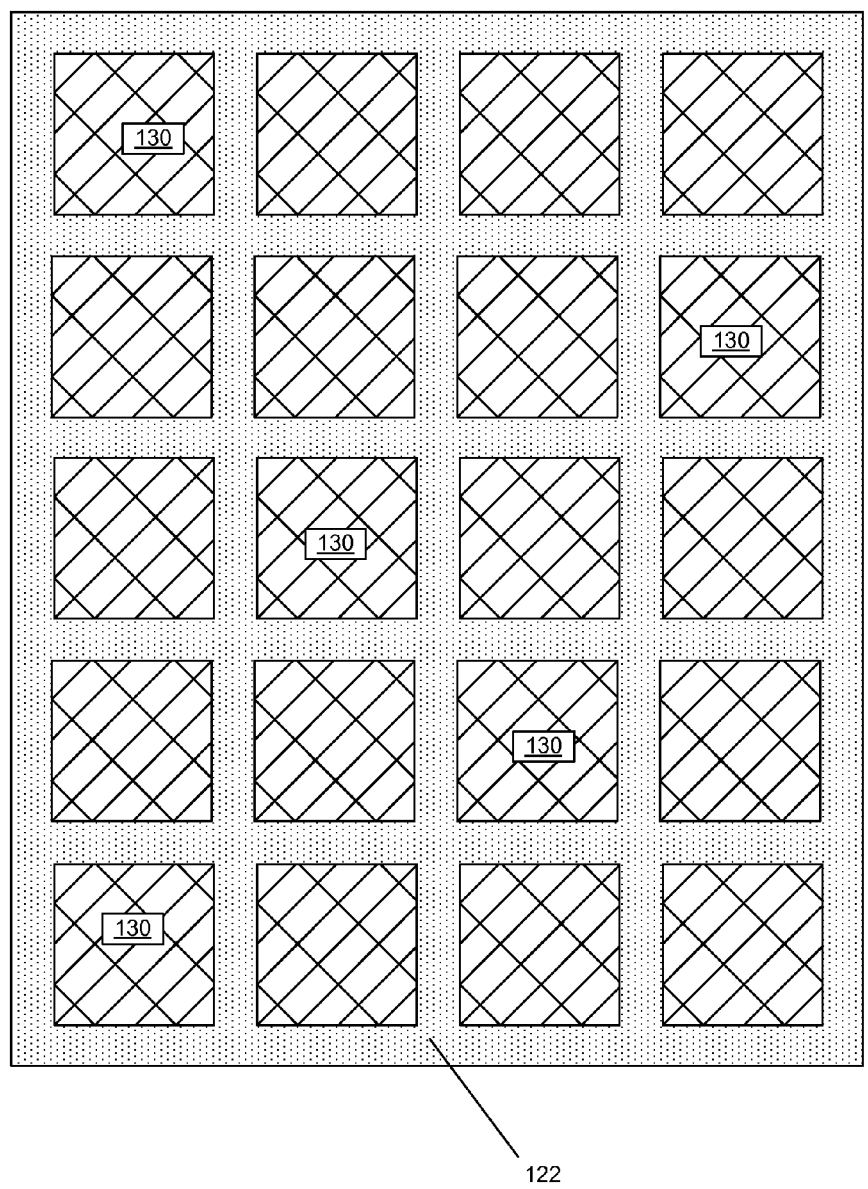

FIGS. 2A-2S depict various illustrative novel methods disclosed herein for forming elastically relaxed silicon-germanium (SiGe) virtual substrates on bulk silicon. With reference to FIG. 2A, a relaxed silicon-germanium (SiGe) virtual substrate will be formed above a bulk silicon substrate 102. As will be appreciated by those skilled in the art, a "relaxed" material is one that has about the same lattice constant as it would if it were a bulk substrate of such material. Additionally, a "strained" material is material wherein the lattice constant of that material is modified relative to its lattice constant in a bulk state, which happens, for example, when a relatively thin layer of SiGe is grown on a bulk silicon substrate. Also depicted is an illustrative patterned etch mask layer 104 formed above the substrate 102. The patterned etch mask layer 104 is intended to be representative of any type of patterned masking layer that may be formed using techniques well known to those skilled in the art. In some applications, the patterned masking layer 104 may be comprised of a single layer of material, e.g., silicon nitride, a photoresist material, or it may be comprised of multiple layers of material, a layer of silicon dioxide and a layer of silicon nitride formed on the layer of silicon dioxide. The layer 104 may be patterned using any of a variety of known techniques, e.g., traditional photolithography, EUV or emersion lithography, etc.

FIG. 2B depicts the substrate 102 after at least one illustrative etching process, such as an anisotropic etching process, was performed through the patterned etch mask 104 to define a plurality of trenches 105 in the substrate 102. FIG. 2C is a simplistic plan view of the device shown in FIG. 2B. This etching process results in the definition of a plurality of fin-type structures 106. The width 106W and the height 106H of the fins 106, the fin pitch 108 and the width 105W of the trenches 105 may vary depending upon the particular application. In one illustrative embodiment, the fin width 106W may be on the order of about 20-50 nm, and the fin height 106H may be about 100-200 nm, the fin pitch 108 may be about 100-1000 nm, and the trench width 105W may be about 60-900 nm. In general, in this embodiment, the fin width 106W should be less than the trench width 105W, e.g., the fin width should be about 2-20% of the overall trench width 105W. FIG. 2C is a simplistic plan view of the substrate 102 after the trenches 105 were etched into the substrate 102. As indicated, the cross-sectional view (X-X) is depicted in FIG. 2B and it is taken in a direction transverse parallel to the lateral width 105W of the trenches 105.

FIG. 2D depicts the substrate after a sacrificial silicon-germanium (SiGe) material 110 is epitaxially grown so as to substantially fill the trenches 105. In one illustrative embodiment, the sacrificial SiGe material 110 may have a germanium concentration that falls within the range of about 20-40% germanium. The formation of the sacrificial SiGe material 110 may result in the sacrificial SiGe material 110 having a substantially planar upper surface 110A or it may have a recessed upper surface 110B if the trench 105 is slightly under filled. Either situation is acceptable. For ease of illustration, the sacrificial SiGe material 110 will be depicted as having the substantially planar upper surface 110A in the subsequent drawings. Since the sacrificial SiGe material 110 has a larger lattice constant than the silicon substrate 102, the SiGe material 110 is in a compressively strained state at this point, the magnitude of the strain depends upon a variety of factors such as the amount of germanium in the sacrificial SiGe material 110.

With reference to FIGS. 2E-2H, the next process operations include removing the patterned hard mask layer 104, forming a relatively thin relaxed silicon layer 112 above the upper surface of the sacrificial SiGe material 110 and above the upper surface of the fin structures 106 and thereafter performing an etching process through a patterned masking layer (not shown) to cut the fin-type structures 106 and the sacrificial SiGe material 110. It will be appreciated that, prior to forming the fin cut openings 114, the sacrificial SiGe material 110 is effectively encapsulated in silicon material, i.e., between two fins 106 and underneath the silicon layer 112. FIG. 2E is a plan view depicting the substrate after the silicon layer 112 was formed and after a fin cut opening 114 was formed between two sections of cut fins 106. FIG. 2F is a plan view depicting the substrate after the silicon layer 112 was formed and after a fin cut opening 114 was formed on opposite sides of the fins 106 thereby forming a single cut section of fins. The fins 106 and the sacrificial SiGe material 110 that are positioned under the silicon layer 112 are indicated by reference numerals in dashed lines in the plan views. The silicon layer 112 may be formed by performing an epitaxial growth process, and it may be formed to a thickness of about 10-20 nm. The silicon layer 112 is in a substantially relaxed condition. In FIGS. 2G-2H, the bottom 112X of the silicon layer 112 is depicted in dashed lines where it is formed over the fins 106 since it will essentially merge with the silicon material of the fins 106. Additionally, as indicated in FIG. 2E, the formation of the fin cut opening 114 exposes fin cut ends 106X and cut ends 110X of the sacrificial SiGe material 110 on one side of the opening 114 and fin cut ends 106Y and cut ends 110Y of the sacrificial SiGe material 110 on the other side of the opening 114. As indicated in FIG. 2F, the formation of one of the fin cut openings 114 exposes fin cut ends 106L and cut ends 110L of the sacrificial SiGe material 110, while the formation of the other fin cut opening 114 exposes fin cut ends 106R and cut ends 110R of the sacrificial SiGe material 110 on the opposite side of the single section of cut fins 106.

FIGS. 2E-2F contain various cross-sectional views that are depicted in FIGS. 2G and 2H (as well as in later drawings). As indicated in FIG. 2E, the view "X-X" is a cross-sectional view taken through the fins 106 in a direction parallel to the trench width 105W; the view "Y-Y" is a cross-sectional view taken through the long axis of the fins 106; and the view "Z-Z" is a cross-sectional view taken through the trenches 105 and through the sacrificial SiGe material 110. As indicated in FIG. 2F, the view "A-A" is taken through the SiGe material 110, while the view "B-B" is taken through the long axis of the fins 106.

FIGS. 2G-2H are various cross-sectional views of the substrate after the formation of the silicon layer 112 and after the formation of the fin cut openings 114 with a bottom surface 114A. The width 114W of the fin cut openings 114 may vary, e.g., 20-1000 nm. The fin cut openings 114 are formed so that, as shown more fully below, the sacrificial SiGe material 110 may be removed selectively relative to the surrounding silicon materials.

FIGS. 2I-2J are various cross-sectional views of the substrate after a selective etching process was performed to remove the sacrificial SiGe material 110 selectively relative to the surrounding silicon structures, i.e., the fins 106 and the silicon layer 112. As indicated, the removal of the sacrificial SiGe material 110 results in the formation of a plurality of cavities 116. The silicon fins 106 serve as anchors for the thin silicon layer or "bridge" 112 positioned over the cavities 116. In effect, after the sacrificial SiGe material 110 is removed, the silicon layer 112 constitutes a free-standing silicon beam 112A that is "clamped" to two of the anchor fins 106. The sacrificial SiGe material 110 may be removed relative to the surrounding silicon materials using a variety of known etching chemistries, e.g., HCl, $CF_4$, etc., and a high degree of etch selectivity may be obtained where the germanium concentration in the sacrificial SiGe material 110 is 25-40% or higher.

FIGS. 2K-2L are various cross-sectional views of the substrate after the formation of a relatively thick (e.g., 100-200 nm) non-sacrificial SiGe (silicon germanium) material 120 on the exposed silicon surfaces, e.g., the upper and lower surfaces of the thin silicon layer 112, the fins 106 and the bulk substrate 102. In one illustrative embodiment, the non-sacrificial SiGe material 120 may have a germanium concentration that falls within the range of about 10-50% germanium. In the depicted example, the formation of the non-sacrificial SiGe material 120 fills a portion but not all of the cavities 116. Using the methods disclosed herein, the non-sacrificial SiGe material 120 may be formed in both a relaxed and strained condition at the same time. More specifically, the non-sacrificial SiGe material 120 that is formed on at least the upper surface of the silicon layer 112 is in a substantially relaxed condition because the non-sacrificial SiGe material 120 is significantly thicker than the relatively thin silicon layer 112. That is, as a result of this thickness difference, the thin silicon layer 112 is elastically stretched to accommodate the lattice of the non-sacrificial SiGe material 120. Stated another way, the strain in the overall material system (the non-sacrificial SiGe material 120 and silicon layer 112) is almost entirely induced on the relatively thinner silicon layer 112. The non-sacrificial SiGe material 120 positioned above the silicon layer 112 constitutes a substantially relaxed virtual substrate upon which a channel semiconductor material may be formed, as discussed more fully below. In contrast, the non-sacrificial SiGe material 120 that is grown on the bulk substrate 102 is formed in a strained condition (compressive), because the non-sacrificial SiGe material 120 matches the lattice of much more massive (infinitely thicker) silicon substrate 102. That is, for the non-sacrificial SiGe material 120 formed on the substrate 102, the strain in the overall material system (the non-sacrificial SiGe material 120 and substrate 102) is almost entirely induced on the relatively thinner non-sacrificial SiGe material 120.

FIGS. 2M-2N are various cross-sectional views of the substrate after an insulating material 122, such as silicon dioxide (e.g., HARP) was formed so as to overfill the remaining empty portions of the cavities 116 and after a CMP process was performed to remove excess amounts of the insulating material 122 using the upper portion of the non-sacrificial SiGe material 120 (the virtual substrate) as a polish stop layer.

FIGS. 2O-2P are various cross-sectional views of the substrate after an optional process operation was performed to form additional non-sacrificial SiGe material (not separately labeled) on the non-sacrificial SiGe material 120 (i.e., to increase its thickness) so as to insure further relaxation of the non-sacrificial SiGe material (the virtual substrate). The amount of this increased thickness may vary depending upon the particular application (e.g., 10-1000 nm). The additional non-sacrificial SiGe material may be grown by performing known epi deposition processes.

FIGS. 2Q-2R are various cross-sectional views of the substrate after an epitaxially grown layer of strained channel semiconductor material 130 was formed on the substantially relaxed non-sacrificial SiGe material 120 (the virtual substrate). The strained channel semiconductor material 130 will serve as at least the channel region material for such devices. In one embodiment, the strained channel semiconductor material 130 may be comprised of tensile strained silicon material or a compressively strained SiGe material (having a germanium concentration that falls within the range of about 30-50%). Of course, the strained channel semiconductor material 130 cold be comprised of any semiconductor material or semiconductor alloy material, e.g., GaAs on 50% SiGe depending upon a variety of factors such as, for example, the germanium percentage in the SiGe virtual substrate and the thickness of the strained channel semiconductor material 130. The thickness of the strained channel semiconductor material 130 may vary depending upon the application, e.g., it may have a thickness that falls within the range of about 2-100 nm. After the strained channel semiconductor material 130 is initially formed, its thickness may be reduced and any surface roughness may be reduced by performing one or more CMP processes. In the depicted example, the channel semiconductor materials 130 are essentially separate islands of strained channel semiconductor material wherein an isolation material may be formed in and above the remaining portions of the fin cut openings 114 so as to effectively define isolation regions between the separate islands of strained channel semiconductor material 130. FIG. 2S is a simplistic plan view depicting these separate islands of strained channel semiconductor material separated by isolation material 122.

Figure 3A:
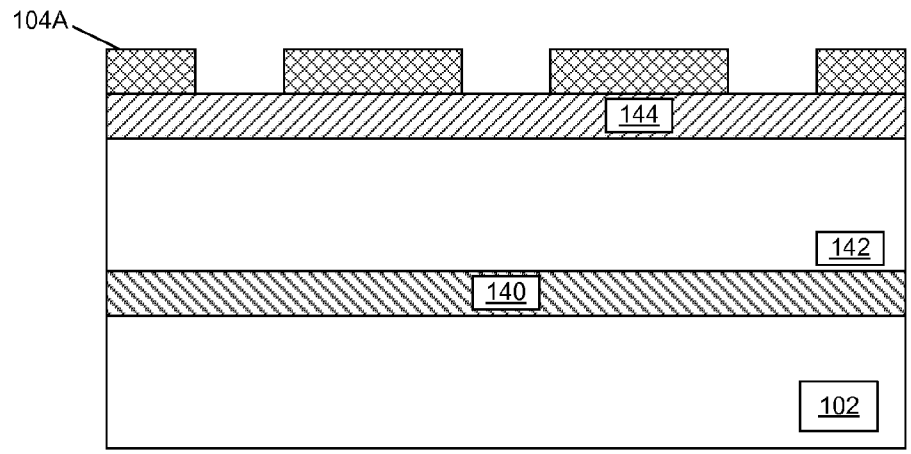
FIGS. 3A-3P depict yet other illustrative novel methods disclosed herein for forming elastically relaxed silicon-germanium (SiGe) virtual substrates on bulk silicon.
Figure 3B:
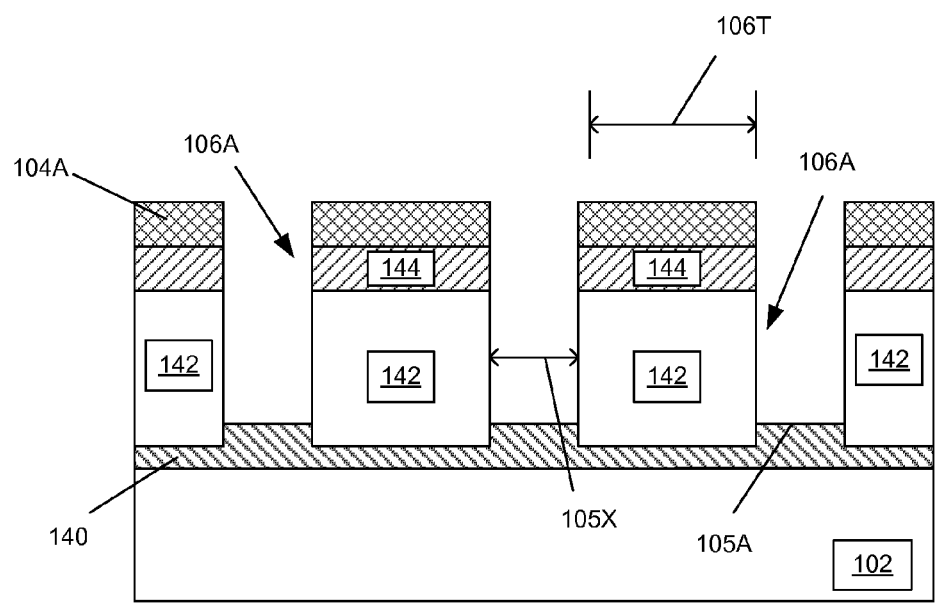
Figure 3C:
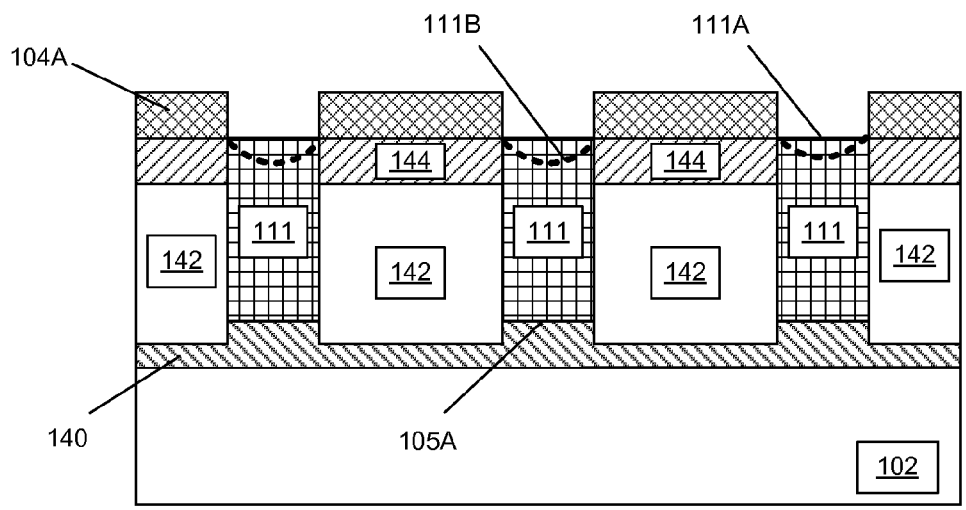
Figure 3D:
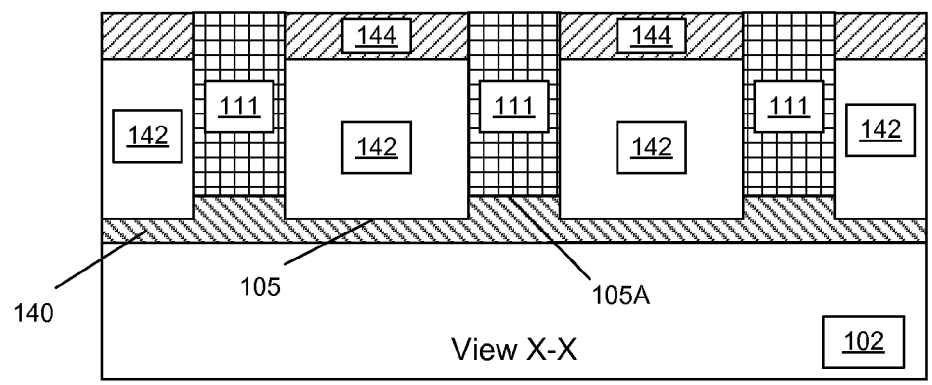
Figure 3E:
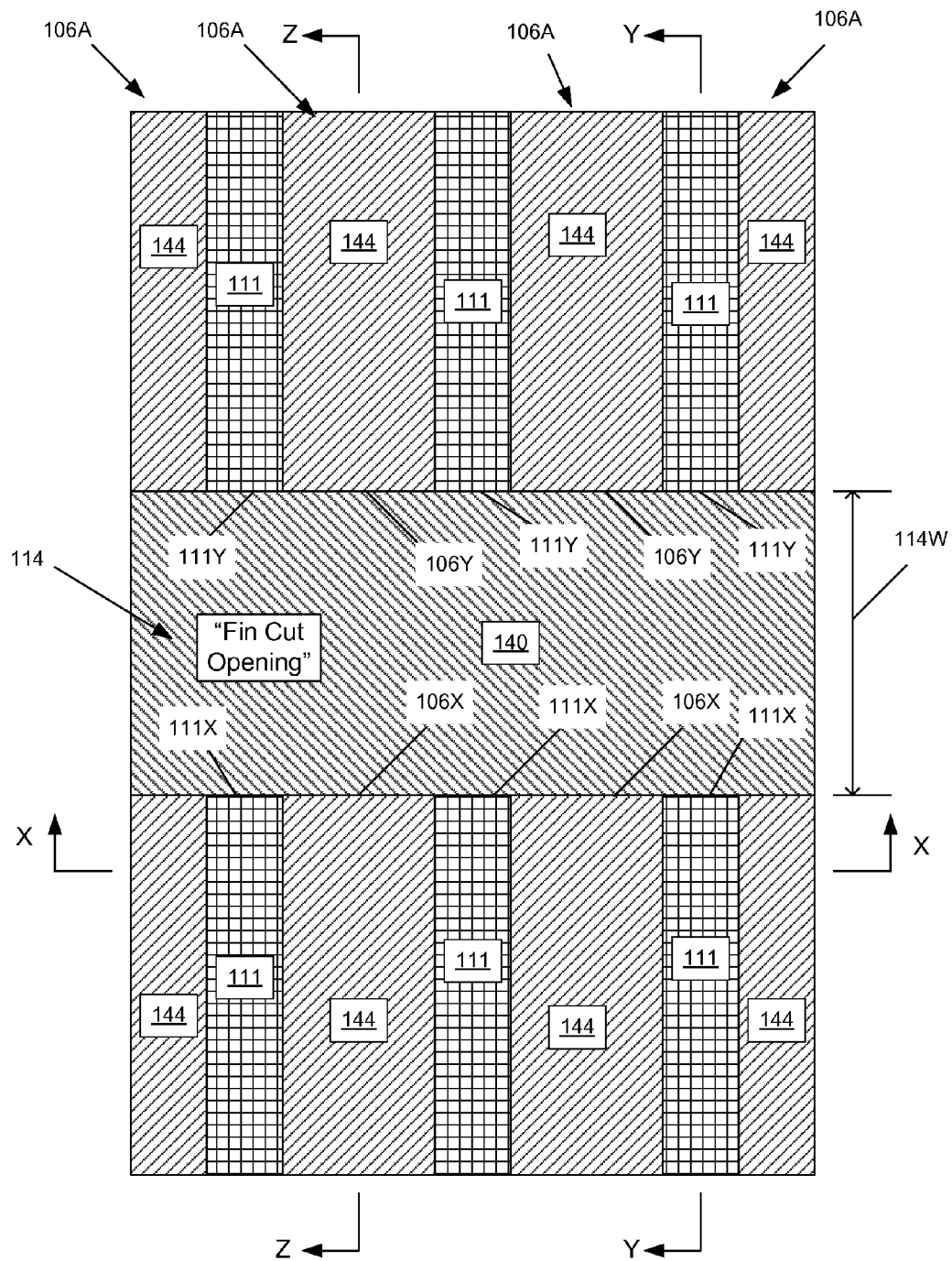
Figure 3F:
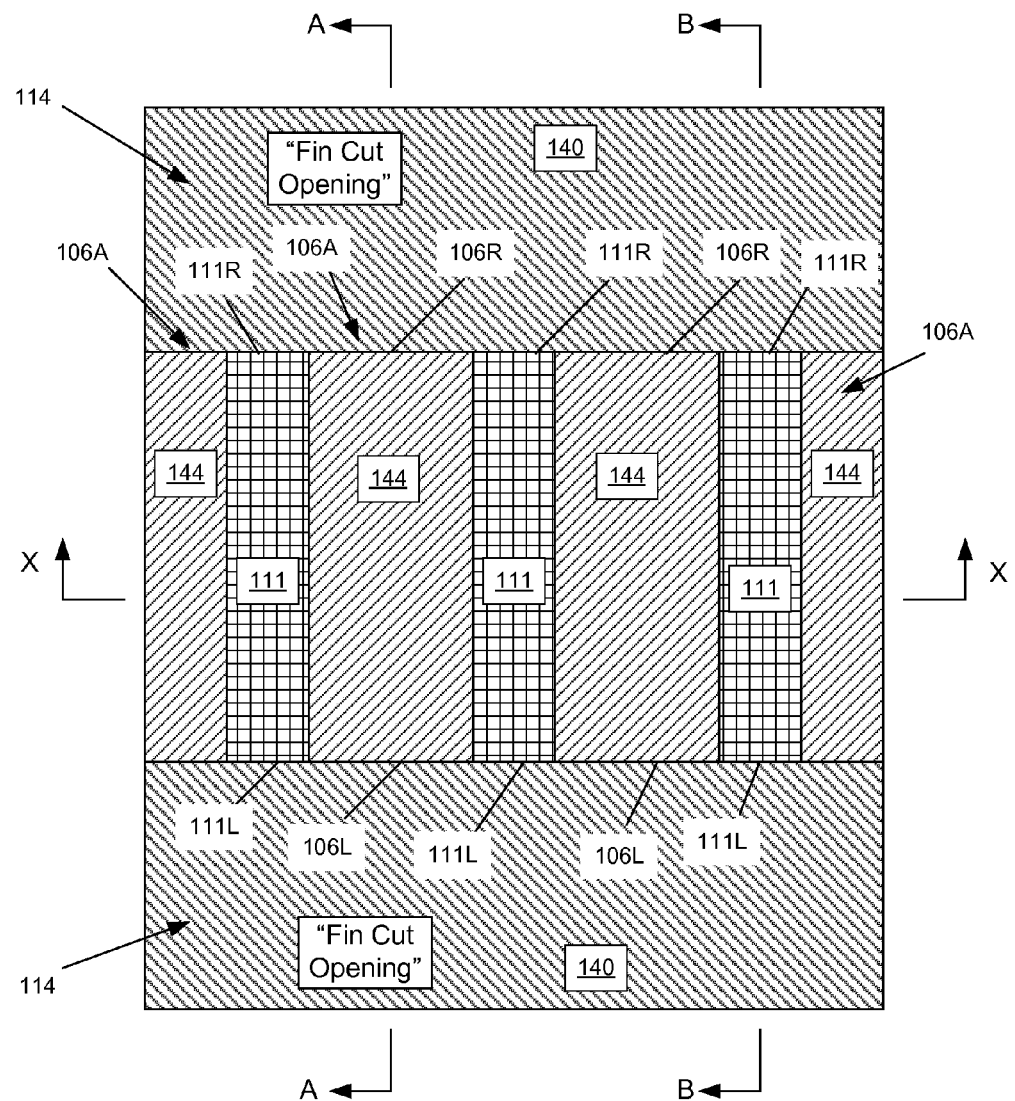
Figure 3G:
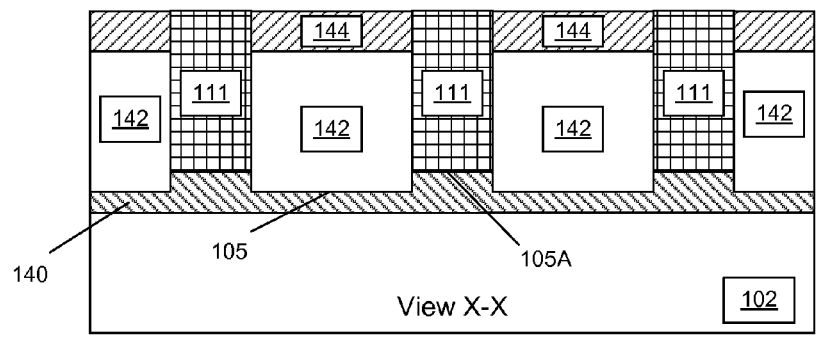
Figure 3G:
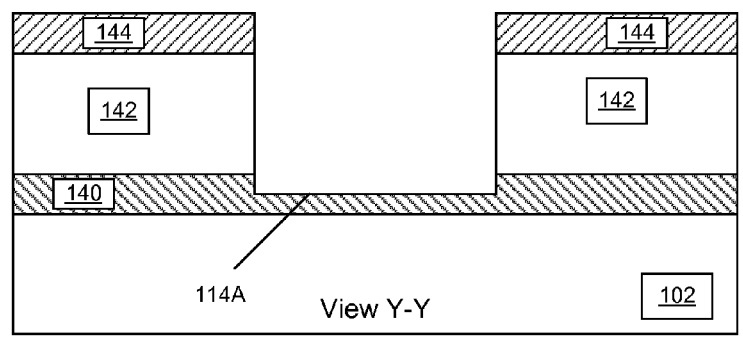
Figure 3G:
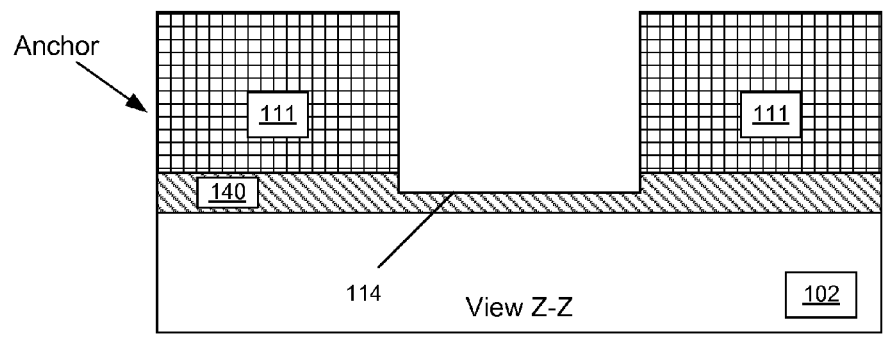
Figure 3H:
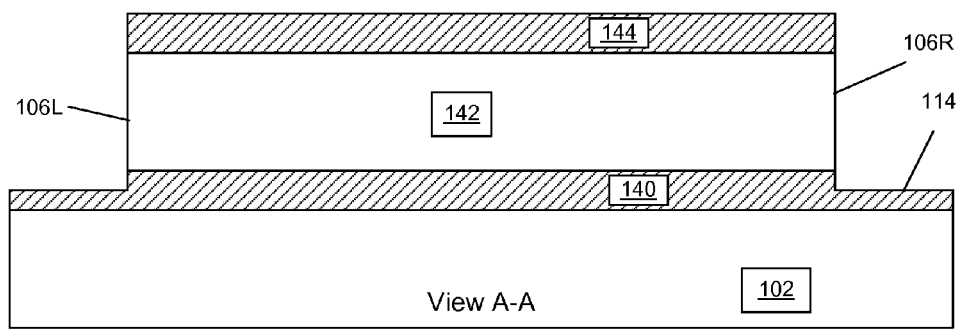
Figure 3H:
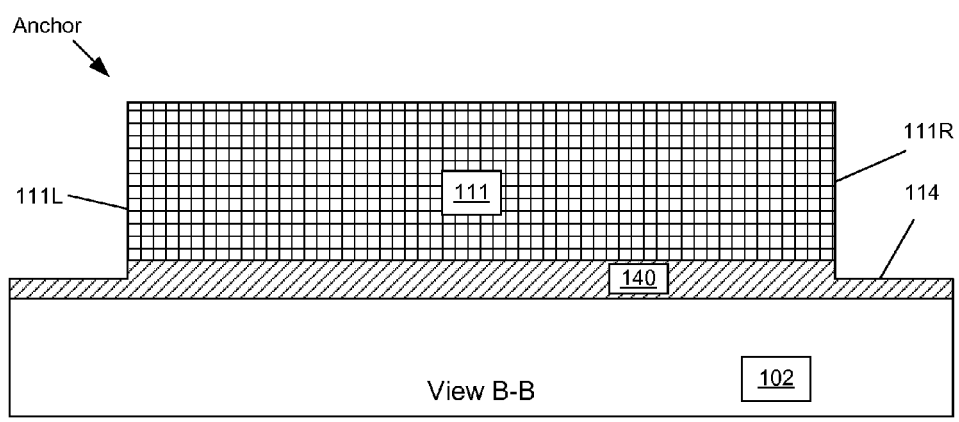
Figure 3I:
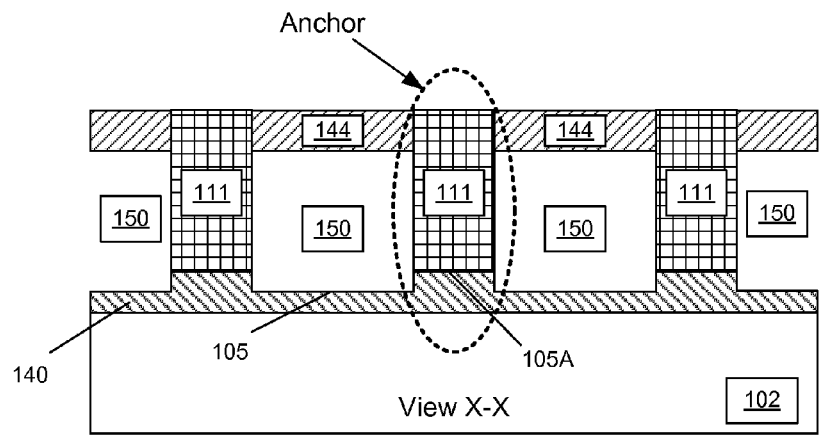
Figure 3I:
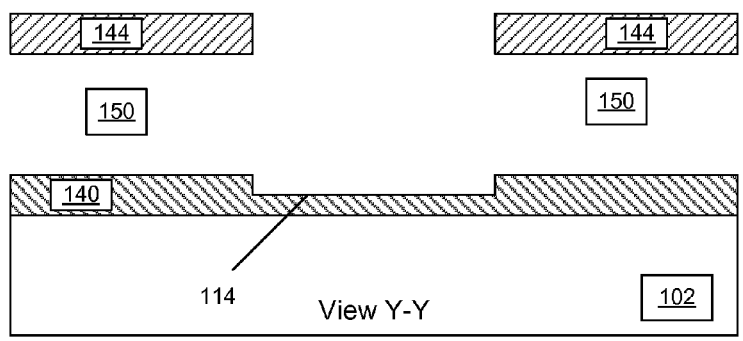
Figure 3I:
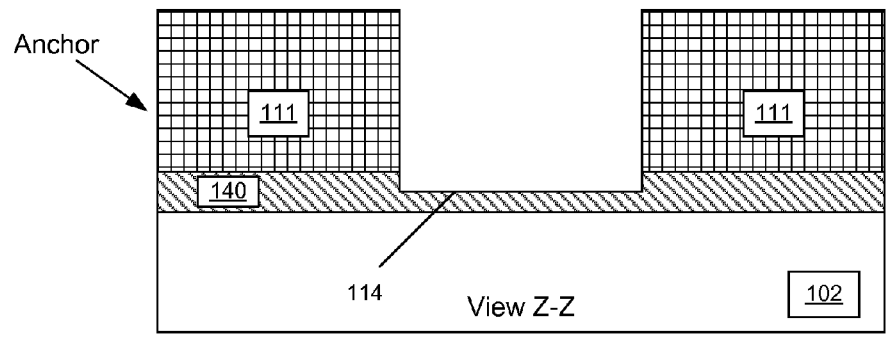
Figure 3J:
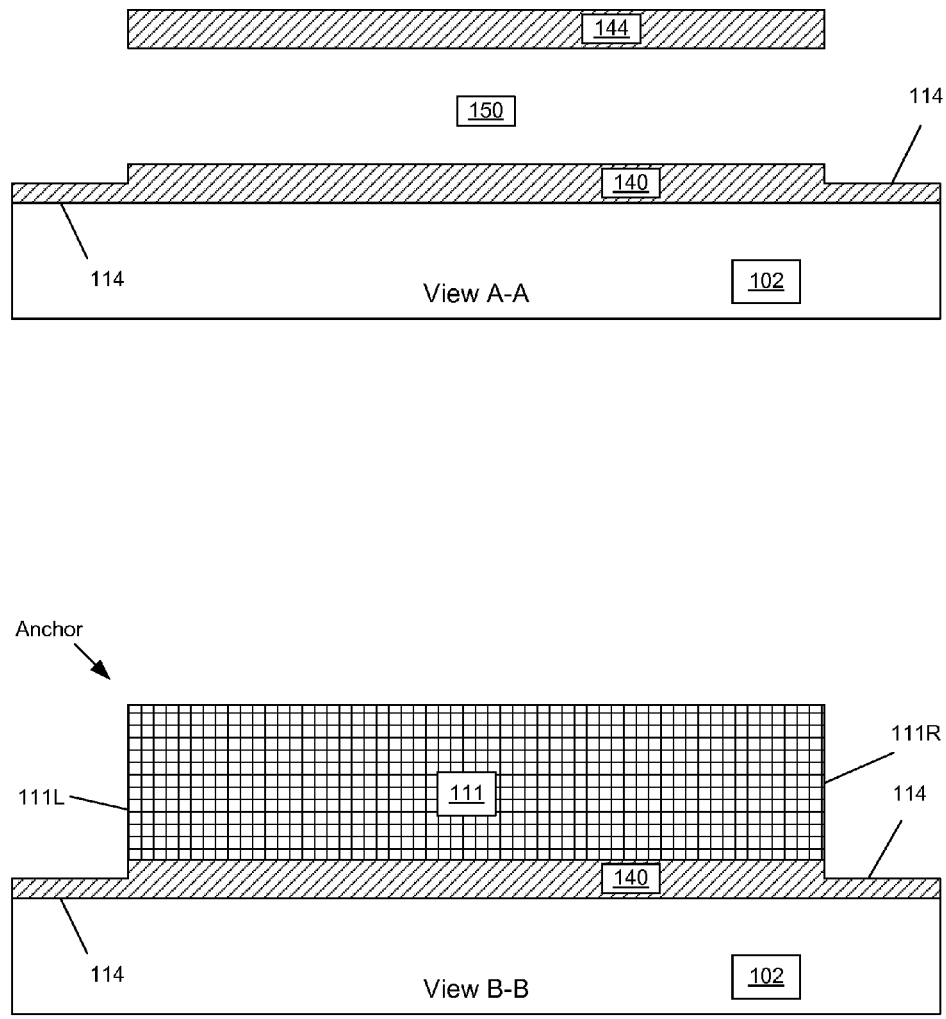
Figure 3K:
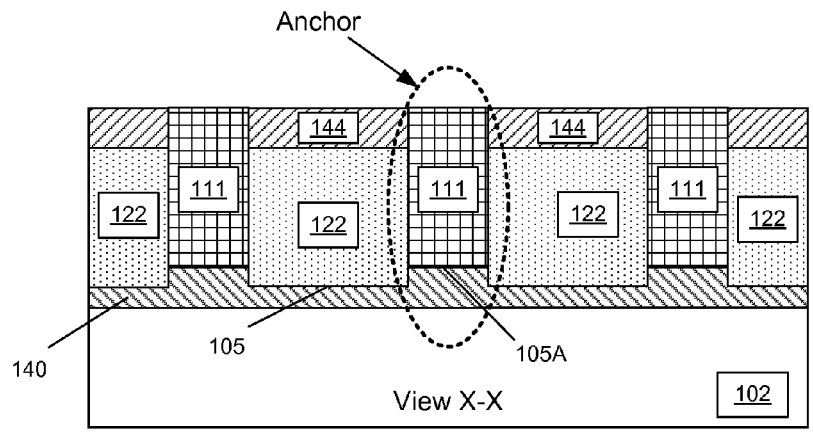
Figure 3K:
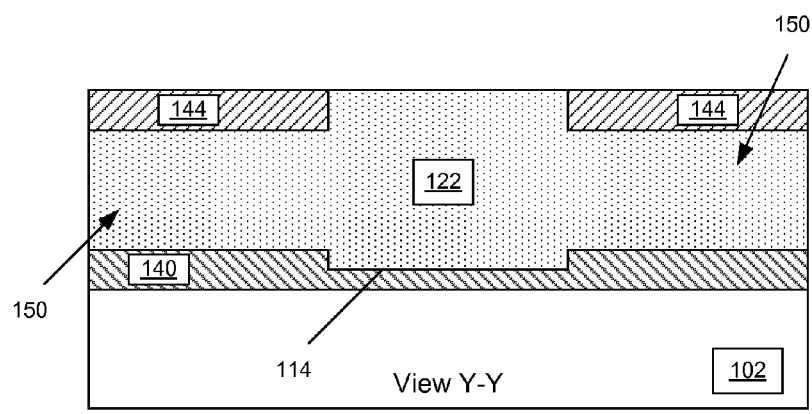
Figure 3K:
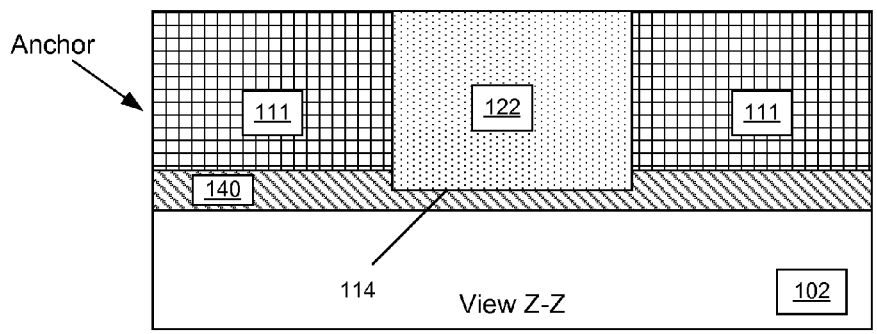
Figure 3L:
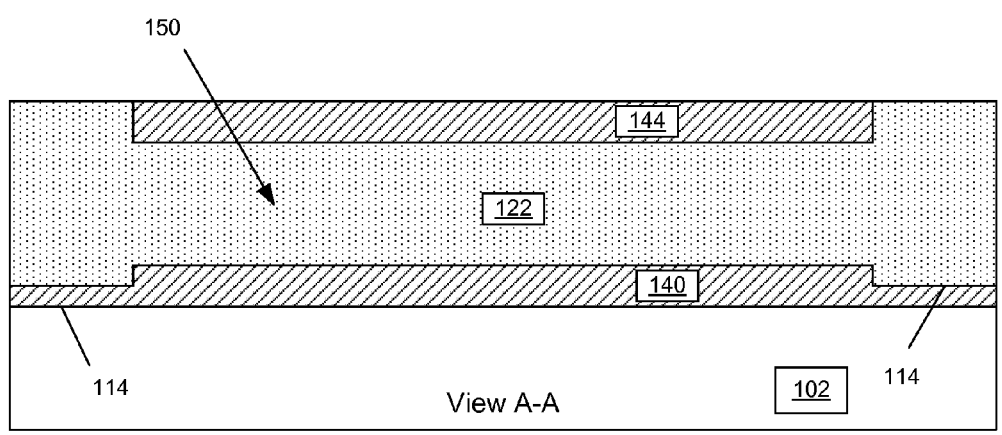
Figure 3L:
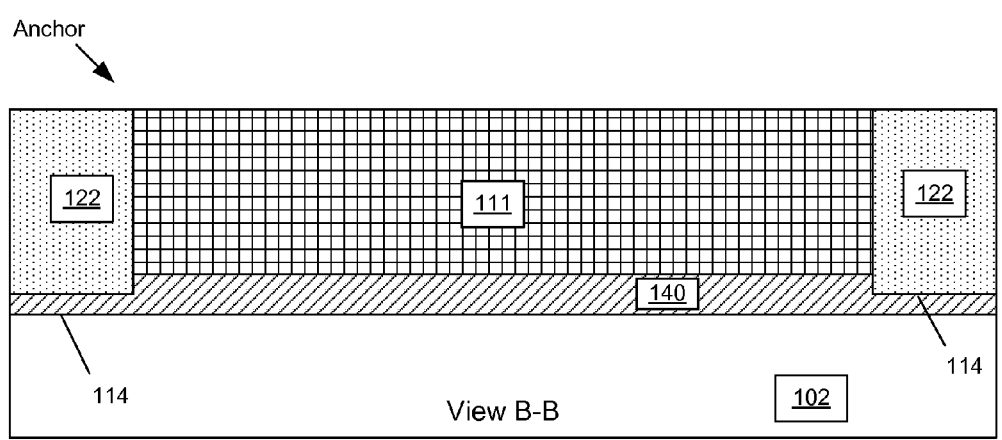
Figure 3M:
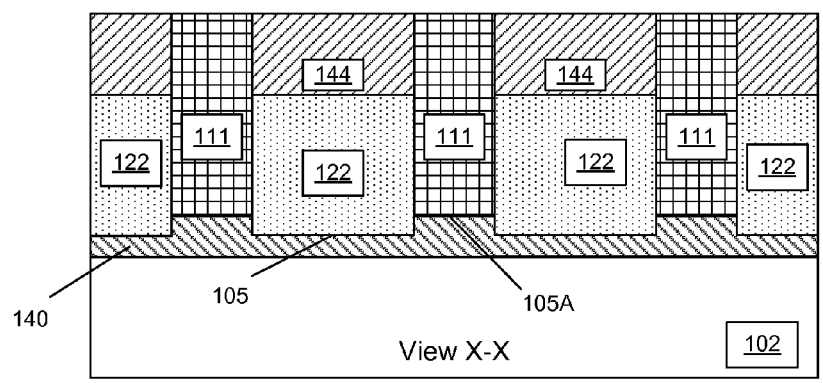
Figure 3M:
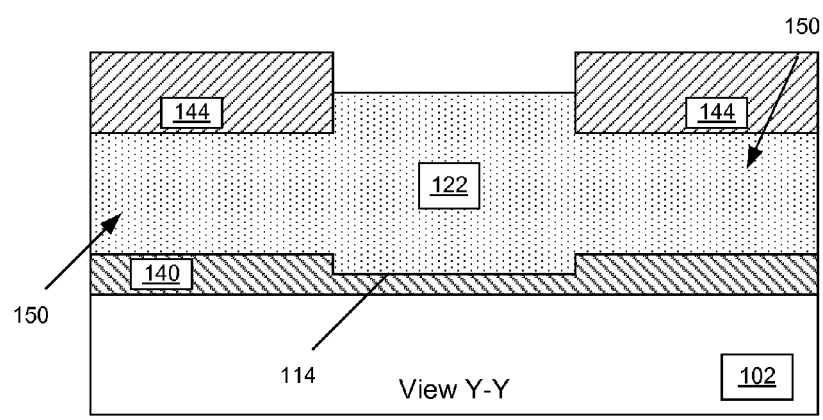
Figure 3M:
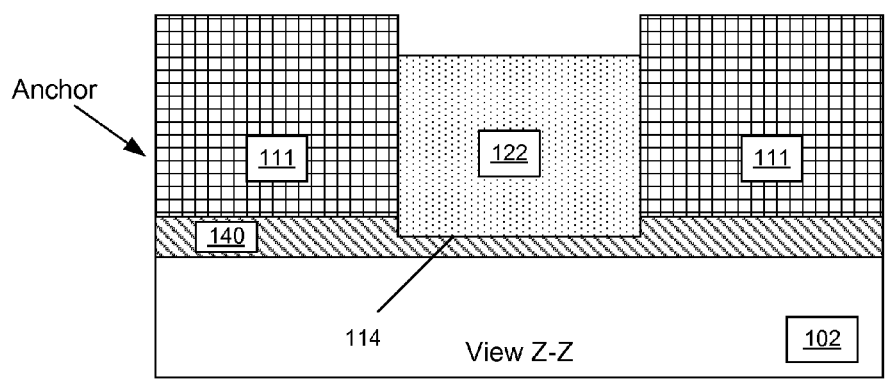
Figure 3N:
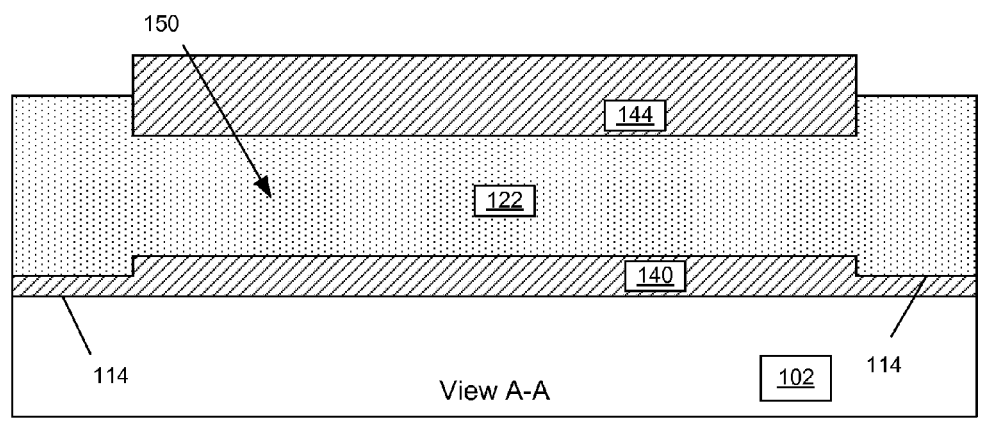
Figure 3N:
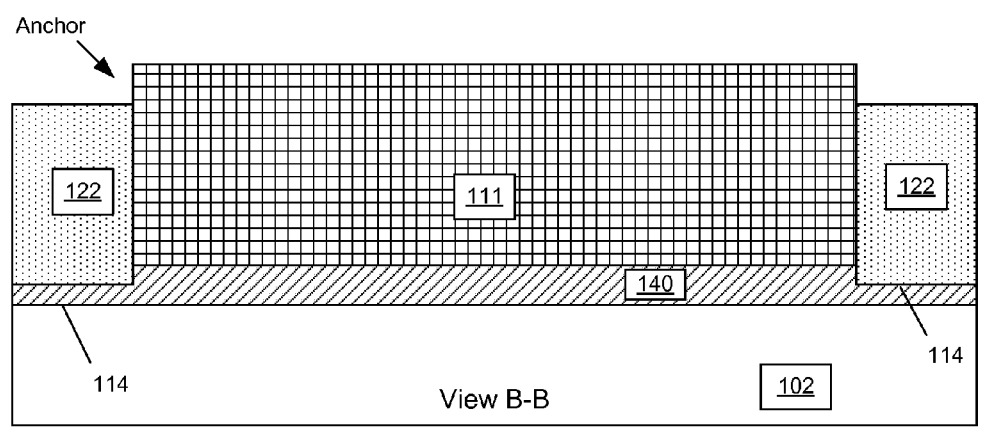
Figure 3O:
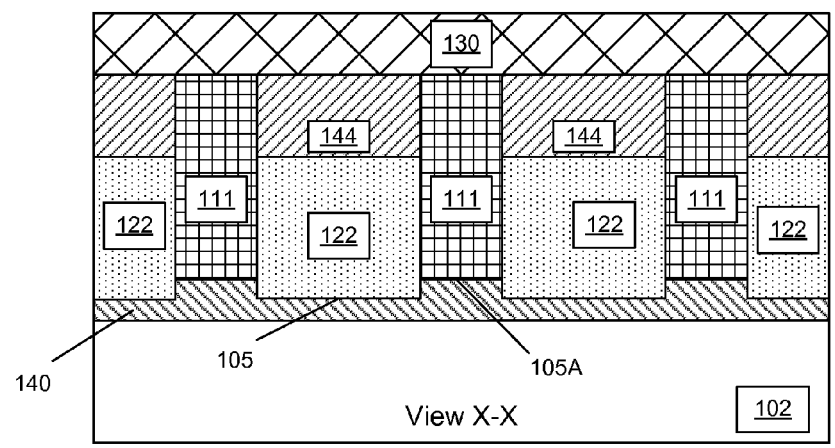
Figure 3O:
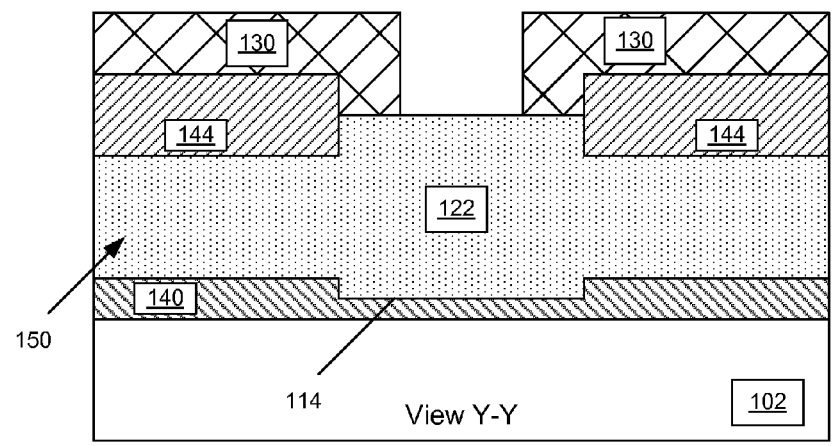
Figure 3O:
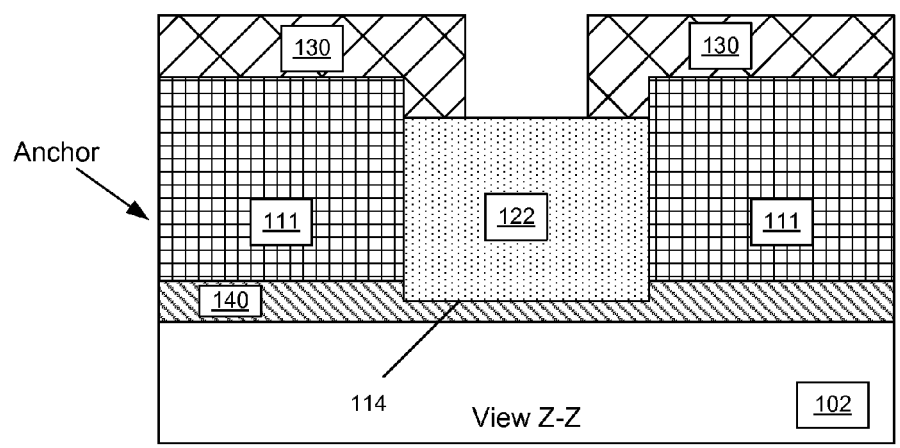
Figure 3P:
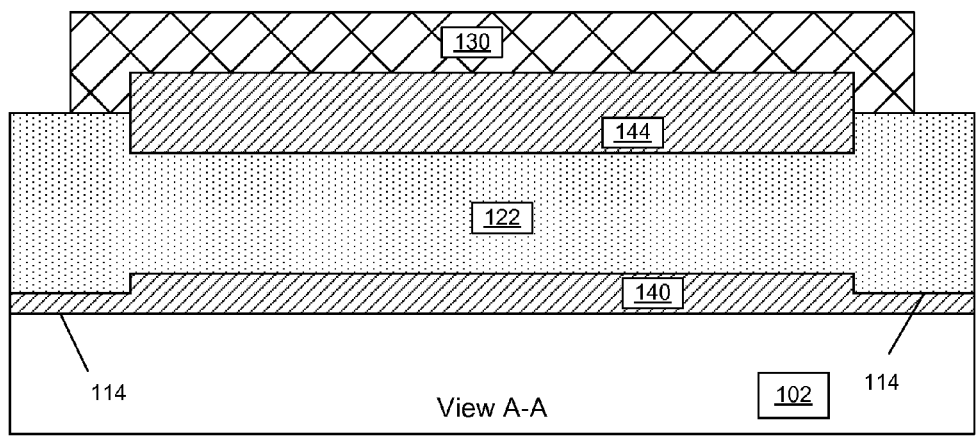
Figure 3P:
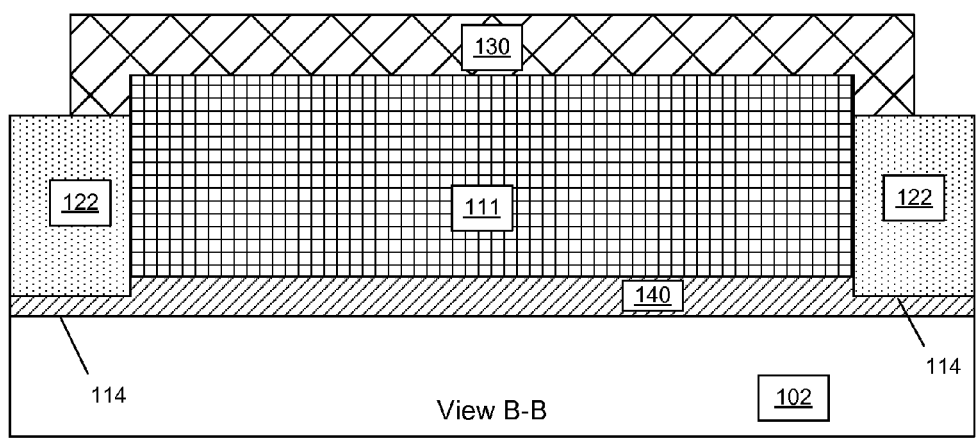

FIGS. 3A-3P depict yet other illustrative novel methods disclosed herein for forming elastically relaxed silicon-germanium (SiGe) virtual substrates on bulk silicon. Relative to the embodiment depicted in FIGS. 2A-2S above, in this embodiment, some silicon material will be sacrificial in nature instead of the sacrificial SiGe material 110 above.

In the embodiment shown in FIGS. 3A-3P, the process begins with the formation of a composite substrate that will be comprised of a plurality of semiconductor material layers. More specifically, a non-sacrificial strained SiGe layer 140, a relaxed sacrificial silicon layer 142, and a non-sacrificial strained SiGe layer 144 were sequentially formed above the bulk silicon substrate 102 by performing known epitaxial deposition processes. The composition and thickness of these layers of material may vary depending upon the particular application. In one illustrative embodiment, the non-sacrificial strained SiGe layers 140, 144 may be formed to a thickness of about 10-30 nm and they may have a germanium concentration of about 20-30%. Of course, the non-sacrificial SiGe layers 140, 144 need not each be formed to the same specification. In one embodiment, the relaxed, sacrificial silicon layer 142 may have a thickness of about 10-100 nm. After the final non-sacrificial SiGe layer 144 is formed, an illustrative patterned etch mask layer 104A is formed above the SiGe layer 144. The patterned etch mask layer 104A is intended to be representative of any type of patterned masking layer that may be formed using techniques well known to those skilled in the art. In some applications, the patterned masking layer 104A may be comprised of a single layer of material, e.g., silicon nitride, a photoresist material, or it may be comprised of multiple layers of material, a layer of silicon dioxide and a layer of silicon nitride formed on the layer of silicon dioxide. The layer 104A may be patterned using any of a variety of known techniques, e.g., traditional photolithography, EUV or emersion lithography, etc.

FIG. 3B depicts the substrate after at least one illustrative etching process, such as an anisotropic etching process, was performed through the patterned etch mask 104A to define a plurality of trenches 105A. This etching process results in the definition of a plurality of composite fin-type structures 106A that, depending upon the depth of the trenches 105, are comprised of at least the non-sacrificial SiGe material layer 144 and the sacrificial silicon layer 142. Relative to the embodiment shown in FIGS. 2A-2P, in this embodiment, the width 105X of the trenches 105A is less than the trenches 105, and the width 106T of the fin-like structures 106A is greater than the width 106W of the fins 106. The size of these structures may vary depending upon the particular application. In one illustrative embodiment, the trench width 105X may be about 20-50 nm and the fin width 106T may be on the order of about 100-1000 nm, and preferably much wider than the trench width 105X. In the depicted example, the trench 105A has a depth such that it stops in the non-sacrificial SiGe layer 140. However, such a configuration is not required as the trench 105A may extend through the non-sacrificial SiGe layer 140 and into the substrate 102.

FIG. 3C depicts the substrate after a non-sacrificial silicon-germanium (SiGe) material 111 was epitaxially grown so as to substantially fill the trenches 105A. In one illustrative embodiment, the non-sacrificial SiGe material 111 may have a germanium concentration that falls within the range of about 20-30% germanium. The formation of the non-sacrificial SiGe material 111 may result in the SiGe material 111 having a substantially planar upper surface 111A or it may have a recessed upper surface 111B if the trench 105A is slightly under filled. Either situation is acceptable. For ease of illustration, the non-sacrificial SiGe material 111 will be depicted as having the substantially planar upper surface 111A in the subsequent drawings. Since the non-sacrificial SiGe material 111 has a larger lattice constant than the silicon substrate 102, the SiGe material 111 is in a compressively strained state at this point (given that the SiGe layer 140 has taken on the lattice of the substrate 102 when it was formed), the magnitude of which depends upon a variety of factors, such as the amount of germanium in the non-sacrificial SiGe material 111. It will be appreciated that, in the depicted example, the combination of the non-sacrificial SiGe material 111 and the non-sacrificial SiGe layers 140 and 142 effectively encapsulate the silicon material 142.

FIG. 3D depicts the substrate after the patterned masking layer 104A was removed.

With reference to FIGS. 3E-3H, the next process operation of performing an etching process through a patterned masking layer (not shown) to cut the composite fin-type structures 106A is depicted. FIG. 3E is a plan view depicting the substrate after a fin cut opening 114 was formed between two sections of cut composite fins 106A. FIG. 3F is a plan view depicting the substrate after a fin cut opening 114 was formed on opposite sides of the composite fins 106A thereby forming an single cut section of the composite fins 106A. The sacrificial silicon material 142 is not shown in the plan views but it is positioned underneath the non-sacrificial SiGe layer 144 and positioned between the non-sacrificial SiGe materials 111 that were formed in the trenches 105A. Additionally, as indicated in FIG. 3E, the formation of the fin cut opening 114 exposes fin cut ends 106X of the sacrificial silicon material and cut ends 111X of the non-sacrificial SiGe material 111 on one side of the opening 114 and fin cut ends 106Y of the sacrificial silicon material and cut ends 111Y of the non-sacrificial SiGe material 111 on the other side of the opening 114. As indicated in FIG. 3F, the formation of one of the fin cut openings 114 exposes fin cut ends 106L of the sacrificial silicon material and cut ends 111L of the non-sacrificial SiGe material 111, while the formation of the other fin cut opening 114 exposes fin cut ends 106R of the sacrificial silicon material and cut ends 111R of the non-sacrificial SiGe material 111 on the opposite side of the single section of cut fins 106A.

FIGS. 3E-3F contain various cross-sectional views that are depicted in FIGS. 3G and 3H (as well as in later drawings). As indicated in FIG. 3E, the view "X-X" is a cross-sectional view taken through the fins 106A in a direction parallel to the trench width 105X; the view "Y-Y" is a cross-sectional view taken through the trenches 105A and through the non-sacrificial SiGe material 111; and the view "Z-Z" is a cross-sectional view taken through the long axis of the fins 106A. As indicated in FIG. 3F, the view "A-A" is taken through the long axis of the fins 106A, while the view "B-B" is taken through the non-sacrificial SiGe material 111.

FIGS. 3G-3H are various cross-sectional views of the substrate after the formation of the fin cut openings 114 with a bottom surface 114A. The width 114 of the fin cut openings 114 may vary, e.g., 20-1000 nm. The fin cut openings 114 are formed so that, as shown more fully below, the sacrificial silicon material 142 may be removed selectively relative to the surrounding non-sacrificial SiGe materials, i.e., the SiGe material 111 and the SiGe layers 140, 144. In the depicted example, the fin cut opening 114 has a depth such that it stops in the SiGe layer 140. However, such a configuration is not required as the fin cut opening 114 may extend through the SiGe layer 140 and into the substrate 102.

FIGS. 3I-3J are various cross-sectional views of the substrate after a selective etching process was performed to remove the sacrificial silicon material 142 selectively relative to the surrounding non-sacrificial SiGe materials, i.e., relative to the SiGe material 111 and the SiGe layers 140, 144. As indicated, the removal of the sacrificial silicon material 142 results in the formation of a plurality of cavities 150. The non-sacrificial SiGe material 111 serves as anchors for the thin, relaxed non-sacrificial SiGe layer or "bridge" 144 positioned over the cavities 150. In the drawings, the SiGe materials 111, the SiGe layer 140 and the SiGe layer 144 are depicted as being separate and distinct structures, but in a real-world device, the SiGe materials will effectively merge into a substantially uniform SiGe material due to the nature of the epitaxial growth process. In effect, after the sacrificial silicon material 142 is removed, the non-sacrificial SiGe layer 144 constitutes a free-standing relaxed SiGe beam that is "clamped" to two of the anchors of SiGe material 111. Once the sacrificial silicon material 142 is removed, the essentially free-standing SiGe beam (the layer 144) elastically relaxes without any substantial defects being generated. The sacrificial silicon material 142 may be removed relative to the surrounding non-sacrificial SiGe materials using a variety of known etching chemistries, e.g., $CF_4$ and its H involving variants, etc., and a high degree of etch selectively may be obtained where the germanium concentration in the sacrificial SiGe material 111 is 25-30% or higher.

FIGS. 3K-3L are various cross-sectional views of the substrate after the above-described insulating material 122, such as silicon dioxide (e.g., HARP) was formed so as to overfill the remaining empty portions of the cavities 150 and after a CMP process was performed to remove excess amounts of the insulating material 122 using the upper portion of the non-sacrificial SiGe materials 111 and 144 as a polish stop layer.

FIGS. 3M-3N are various cross-sectional views of the substrate after an optional process operation was performed to form additional SiGe material (i.e., to increase its thickness) on the SiGe materials 111, 144 so as to insure further relaxation of the SiGe material upon which the channel semiconductor material will be grown. The amount of this increased thickness may vary depending upon the particular application (e.g., 10-1000 nm). The additional SiGe material may be grown by performing known epi deposition processes.

FIGS. 3O-3P are various cross-sectional views of the substrate after the above-described epitaxially grown layer of strained channel semiconductor material 130 was formed on the substantially relaxed SiGe material (the virtual substrate).

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
    forming a plurality of silicon fin structures in a bulk silicon substrate, said silicon fin structures being separated by a trench;
    forming a sacrificial SiGe material in said trench between said silicon fin structures;
    forming a layer of silicon above an upper surface of said silicon fin structures and above an upper surface of said sacrificial SiGe material, said layer of silicon having a lower surface and an upper surface;
    performing at least one etching process so as to cut said silicon fin structures and said sacrificial SiGe material, thereby exposing cut end surfaces of said sacrificial SiGe material;
    performing at least one etching process to selectively remove said sacrificial SiGe material relative to at least said silicon fin structures and said layer of silicon, said removal of said sacrificial SiGe material defining a cavity between said silicon fin structures, said lower surface of said layer of silicon and said bulk silicon substrate;
    forming a non-sacrificial SiGe material on said upper and lower surfaces of said layer of silicon and on said bulk substrate, said non-sacrificial SiGe material filing a portion, but not all, of said cavity;
    forming a layer of insulating material in any remaining portion of said cavity not filled by said non-sacrificial SiGe material; and
    forming a layer of strained channel semiconductor material above said non-sacrificial SiGe material positioned above said upper surface of said layer of silicon.

2. The method of claim 1, wherein said non-sacrificial SiGe material formed on said upper surface of said layer of silicon is in a relaxed condition and said non-sacrificial SiGe material formed on said bulk substrate is in a strained condition.

3. The method of claim 1, wherein forming said layer of silicon comprises forming said layer of silicon on and in contact with said upper surface of said silicon fin structures and on and in contact with said upper surface of said sacrificial SiGe material.

4. The method of claim 1, wherein forming said layer of silicon comprises performing an epitaxial deposition process to form said layer of silicon to a thickness that falls within a range of about 10-20 nm.

5. The method of claim 1, wherein forming said sacrificial SiGe material in said trench comprises performing an epitaxial deposition process to form said sacrificial SiGe material with a germanium concentration that falls within a range of 20-40%.

6. The method of claim 1, wherein forming said sacrificial SiGe material in said trench comprises forming said sacrificial SiGe material such that it is in a strained condition.

7. The method of claim 1, wherein forming said non-sacrificial SiGe material comprises performing an epitaxial deposition process to form said non-sacrificial SiGe material with a germanium concentration that falls within a range of 10-50%.

8. The method of claim 7, wherein forming said non-sacrificial SiGe material comprises forming said non-sacrificial SiGe material to a thickness that falls within a range of about 100-200 nm.

9. The method of claim 1, wherein, prior to forming said layer of strained channel semiconductor material, the method further comprises forming additional non-sacrificial SiGe material on said non-sacrificial SiGe material positioned above said upper surface of said layer of silicon and wherein said layer of strained channel semiconductor material is formed on said additional non-sacrificial SiGe material.

10. The method of claim 1, wherein forming said layer of strained channel semiconductor material comprises performing an epitaxial deposition process to form a layer of strained channel semiconductor material comprised of silicon, silicon germanium, GaAs, or a semiconductor alloy.

11. The method of claim 1, wherein forming said layer of strained channel semiconductor material comprises forming a layer of strained silicon or silicon germanium material.

12. The method of claim 11, wherein forming said layer of strained channel semiconductor material comprises forming said layer of strained channel semiconductor material to a thickness that falls within a range of about 30-50 nm.

13. The method of claim 1, wherein said layer of strained channel semiconductor material is formed on and in contact with said non-sacrificial SiGe material positioned above said upper surface of said layer of silicon.

14. A method, comprising:
    forming a plurality of silicon fin structures in a bulk silicon substrate, said silicon fin structures being separated by a trench;
    forming a sacrificial SiGe material in said trench between said silicon fin structures;
    forming a layer of silicon on and in contact with an upper surface of said silicon fin structures and on and in contact with an upper surface of said sacrificial SiGe material, said layer of silicon having a lower surface and an upper surface;
    performing at least one etching process so as to cut said silicon fin structures and said sacrificial SiGe material, thereby exposing cut end surfaces of said sacrificial SiGe material;
    performing at least one etching process to selectively remove said sacrificial SiGe material relative to at least said silicon fin structures and said layer of silicon, said removal of said sacrificial SiGe material defining a cavity between said silicon fin structures, said lower surface of said layer of silicon and said bulk silicon substrate;
    forming a non-sacrificial SiGe material on said upper and lower surfaces of said layer of silicon and on said bulk substrate, said non-sacrificial SiGe material filing a portion, but not all, of said cavity, wherein said non-sacrificial SiGe material formed on said upper surface of said layer of silicon is in a relaxed condition and said non-sacrificial SiGe material formed on said bulk substrate is in a strained condition;

forming a layer of insulating material in any remaining portion of said cavity not filled by said non-sacrificial SiGe material; and forming a layer of strained channel semiconductor material above said non-sacrificial SiGe material positioned above said upper surface of said layer of silicon.

15. The method of claim 14, wherein forming said sacrificial SiGe material in said trench comprises performing an epitaxial deposition process to form said sacrificial SiGe material with a germanium concentration that falls within a range of 20-40%.

16. The method of claim 15, wherein forming said sacrificial SiGe material in said trench comprises forming said sacrificial SiGe material such that it is in a strained condition.

17. The method of claim 14, wherein, prior to forming said layer of strained channel semiconductor material, the method further comprises forming additional SiGe material on said non-sacrificial SiGe material positioned above said upper surface of said layer of silicon and wherein said layer of strained channel semiconductor material is formed on said additional non-sacrificial SiGe material.

18. The method of claim 14, wherein said layer of strained channel semiconductor material is formed on and in contact with said non-sacrificial SiGe material positioned above said upper surface of said layer of silicon.

19. A method, comprising:

forming a plurality of silicon fin structures in a bulk silicon substrate, said silicon fin structures being separated by a trench;

performing an epitaxial deposition process to form a strained sacrificial SiGe material in said trench between said silicon fin structures, said strained sacrificial SiGe material having a germanium concentration that falls within a range of 20-40%;

performing an epitaxial deposition process to form a layer of silicon on and in contact with an upper surface of said silicon fin structures and on and in contact with an upper surface of said strained sacrificial SiGe material, said layer of silicon having a lower surface and an upper surface, wherein said layer of silicon has a thickness that falls within a range of about 10-20 nm;

performing at least one etching process so as to cut said silicon fin structures and said sacrificial SiGe material, thereby exposing cut end surfaces of said sacrificial SiGe material;

performing at least one etching process to selectively remove said strained sacrificial SiGe material relative to at least said silicon fin structures and said layer of silicon, said removal of said strained sacrificial SiGe material defining a cavity between said silicon fin structures, said lower surface of said layer of silicon and said bulk silicon substrate;

forming a non-sacrificial SiGe material on said upper and lower surfaces of said layer of silicon and on said bulk substrate, said non-sacrificial SiGe material filing a portion, but not all, of said cavity, wherein said non-sacrificial SiGe material formed on said upper surface of said layer of silicon is in a relaxed condition and said non-sacrificial SiGe material formed on said bulk substrate is in a strained condition and wherein said non-sacrificial SiGe material has a germanium concentration that falls within a range of 10-50% and a thickness that falls within a range of about 100-200 nm;

forming a layer of insulating material in any remaining portion of said cavity not filled by said non-sacrificial SiGe material; and forming a layer of strained channel semiconductor material above said non-sacrificial SiGe material positioned above said upper surface of said layer of silicon.

20. The method of claim 19, wherein, prior to forming said layer of strained channel semiconductor material, the method further comprises forming additional SiGe material on said non-sacrificial SiGe material positioned above said upper surface of said layer of silicon and wherein said layer of strained channel semiconductor material is formed on said additional non-sacrificial SiGe material.

21. The method of claim 19, wherein said layer of strained channel semiconductor material is formed on and in contact with said non-sacrificial SiGe material positioned above said upper surface of said layer of silicon.

22. A method, comprising:

forming a plurality of silicon fin structures in a bulk silicon substrate, said silicon fin structures being separated by a trench;

forming a sacrificial semiconductor material in said trench between said silicon fin structures;

forming a layer of silicon above an upper surface of said silicon fin structures and above an upper surface of said sacrificial semiconductor material, said layer of silicon having a lower surface and an upper surface;

performing at least one etching process to selectively remove said sacrificial semiconductor material relative to at least said silicon fin structures and said layer of silicon, said removal of said sacrificial semiconductor material defining a cavity between said silicon fin structures, said lower surface of said layer of silicon and said bulk silicon substrate;

forming a non-sacrificial semiconductor material on said upper and lower surfaces of said layer of silicon and on said bulk substrate, said non-sacrificial semiconductor material filing a portion, but not all, of said cavity; and forming a layer of strained channel semiconductor material above said non-sacrificial semiconductor material positioned above said upper surface of said layer of silicon.

23. The method of claim 22, wherein said sacrificial semiconductor material is SiGe.

24. The method of claim 23, wherein said non-sacrificial semiconductor material is SiGe.

25. The method of claim 22, wherein forming said layer of strained channel semiconductor material comprises performing an epitaxial deposition process to form a layer of strained channel semiconductor material comprised of silicon, silicon germanium, GaAs, or a semiconductor alloy.

* * * * *